(12) United States Patent
Holland

(10) Patent No.: US 11,217,474 B2
(45) Date of Patent: Jan. 4, 2022

(54) NON-VACUUM, NON-CONTACT SPINNER WAFER CHUCK

(71) Applicant: Government of the United States of America, as represented by the Secretary of Commerce, Gaithersburg, MD (US)

(72) Inventor: Glenn Emerson Holland, Rockville, MD (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 185 days.

(21) Appl. No.: 16/705,798

(22) Filed: Dec. 6, 2019

(65) Prior Publication Data
US 2021/0175114 A1 Jun. 10, 2021

(51) Int. Cl.
*H01L 21/687* (2006.01)

(52) U.S. Cl.
CPC .. *H01L 21/68721* (2013.01); *H01L 21/68735* (2013.01)

(58) Field of Classification Search
CPC . H01L 21/68; H01L 21/683; H01L 21/68707; H01L 21/68714; H01L 21/68721; H01L 21/68728; H01L 21/68735; H01L 21/6875; B23Q 3/02; B23Q 3/12; B23Q 3/18; B23Q 3/183; B23Q 3/186; B23Q 27/003; B23Q 27/006; B25B 1/2431; B25B 1/2436

USPC .......... 269/35, 46, 57, 81, 83, 289 R, 302.1, 269/900, 903
See application file for complete search history.

(56) References Cited

U.S. PATENT DOCUMENTS

| | | | | |
|---|---|---|---|---|
| 5,700,297 A * | 12/1997 | Vollaro | ................... | H01L 21/68 29/25.01 |
| 6,167,893 B1 * | 1/2001 | Taatjes | .............. | H01L 21/68728 134/147 |
| 6,454,865 B1 * | 9/2002 | Goodman | ............. | C23C 16/481 118/728 |
| 6,578,853 B1 * | 6/2003 | Treur | .................... | G03F 7/3021 134/153 |

(Continued)

*Primary Examiner* — Lee D Wilson
*Assistant Examiner* — Robert F Neibaur
(74) *Attorney, Agent, or Firm* — Office of Chief Counsel for National Institute of Standards and Technology

(57) ABSTRACT

A non-vacuum, non-contact spinner wafer chuck including: a basal member including; a fastener receiver that receives a fastener; a chuck collar including: an inner collar wall; and an outer collar wall; and an engagement surface that: receives and engages a wafer; a wafer engagement cam including: an engagement face that engages the wafer; an index cam disposed on the chuck collar and comprising: an index face that faces toward the fastener receiver and that engages the wafer; and a spinner engager disposed on the spinner-side surface of the basal member and comprising: a spinner arm receiver bounded by a wall and that receives a spinner of the wafer processing machine, wherein the wafer engagement cam and the index cam engage the wafer and maintains an orientation of the wafer with respect to the index cam in response to rotation of the wafer relative to the non-vacuum, non-contact spinner wafer chuck.

7 Claims, 25 Drawing Sheets

(56) References Cited

U.S. PATENT DOCUMENTS

| | | | | |
|---|---|---|---|---|
| 7,018,555 | B2* | 3/2006 | Shimbara | G11B 23/505 |
| | | | | 118/730 |
| 2002/0153676 | A1* | 10/2002 | Noguchi | H01L 21/67288 |
| | | | | 279/106 |
| 2020/0171626 | A1* | 6/2020 | Eum | H01L 21/68728 |
| | | | | 134/147 |
| 2021/0233798 | A1* | 7/2021 | Alaniz | H01L 21/68728 |

* cited by examiner (A)  250

(B)  250

NON-VACUUM, NON-CONTACT SPINNER WAFER CHUCK

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference NIST Docket Number 19-024US1.

BRIEF DESCRIPTION

Disclosed is a non-vacuum, non-contact spinner wafer chuck for receiving and indexing a wafer, the non-vacuum, non-contact spinner wafer chuck comprising: a basal member comprising: a wafer-side surface; and a spinner-side surface opposing the wafer-side surface; a fastener receiver disposed in the basal member and bounded by a receiver wall and that receives a fastener that fastens the non-vacuum, non-contact spinner wafer chuck to a wafer processing machine; a chuck collar disposed on the basal member and comprising: an inner collar wall that intersects the basal member at the wafer-side surface; and an outer collar wall opposing the inner collar wall; and an engagement surface that: receives and engages a wafer; and is interposed between the inner collar wall and the outer collar wall; a wafer engagement cam disposed on the chuck collar and comprising: an engagement face that faces toward the fastener receiver and that engages the wafer; an index cam disposed on the chuck collar and comprising: an index face that faces toward the fastener receiver and that engages the wafer, and a spinner engager disposed on the spinner-side surface of the basal member and comprising: a spinner arm receiver bounded by a wall and that receives a spinner of the wafer processing machine, wherein the wafer engagement cam and the index cam engage the wafer and maintains an orientation of the wafer with respect to the index cam in response to rotation of the wafer relative to the non-vacuum, non-contact spinner wafer chuck.

Disclosed is a process for processing a wafer with a non-vacuum, non-contact spinner wafer chuck, the process comprising: disposing the non-vacuum, non-contact spinner wafer chuck on the wafer processing machine; receiving the spinner by the spinner engager; disposing the wafer on the non-vacuum, non-contact spinner wafer chuck; rotating the non-vacuum, non-contact spinner wafer chuck relative to the wafer processing machine with the spinner; engaging, by the wafer engagement cam and the index cam, the wafer and maintaining, by the wafer engagement cam and the index cam, the orientation of the wafer with respect to the index cam in response to rotating the non-vacuum, non-contact spinner wafer chuck relative to the wafer processing machine to process the wafer.

BRIEF DESCRIPTION OF THE DRAWINGS

The following description should not be considered limiting in any way. With reference to the accompanying drawings, like elements are numbered alike.

DETAILED DESCRIPTION

Figure 1:
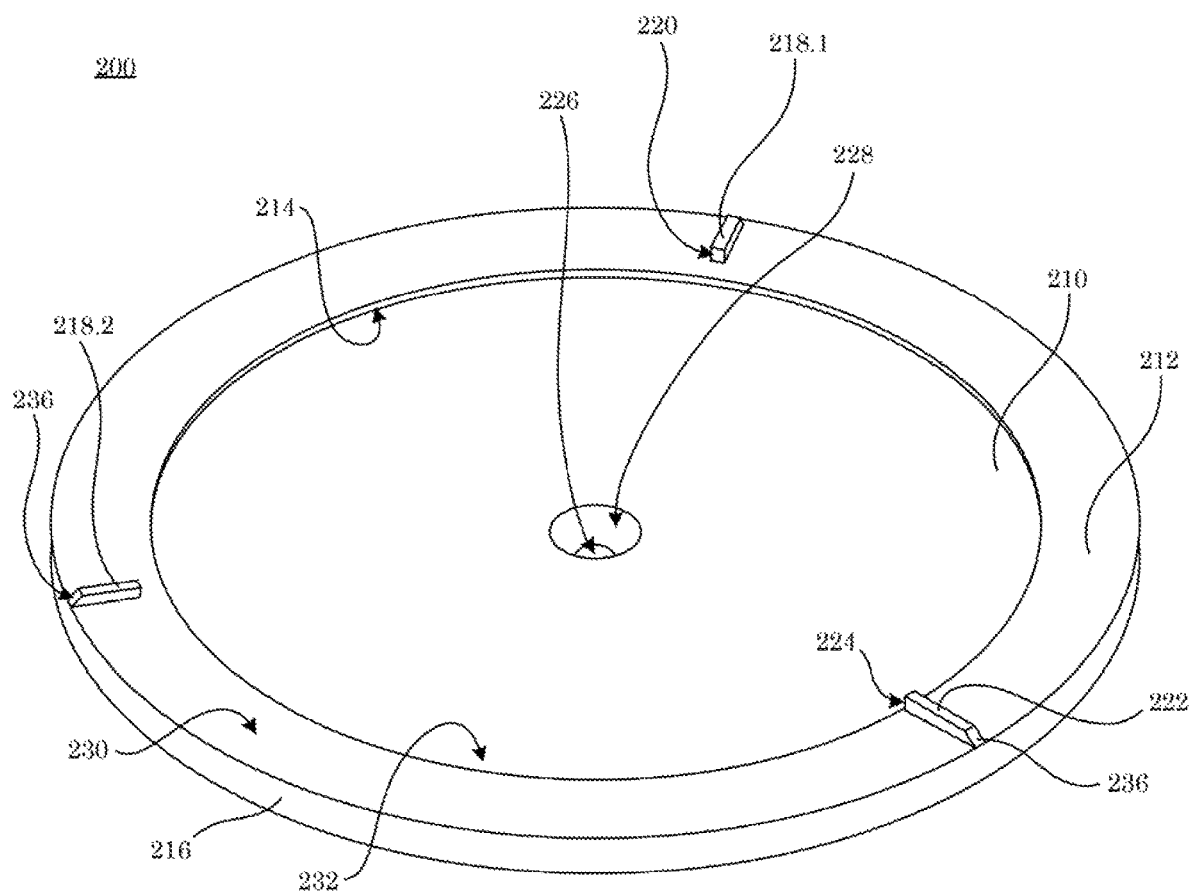
FIG. 1 shows a perspective view of a wafer-side surface of a non-vacuum, non-contact spinner wafer chuck.
Figure 2:
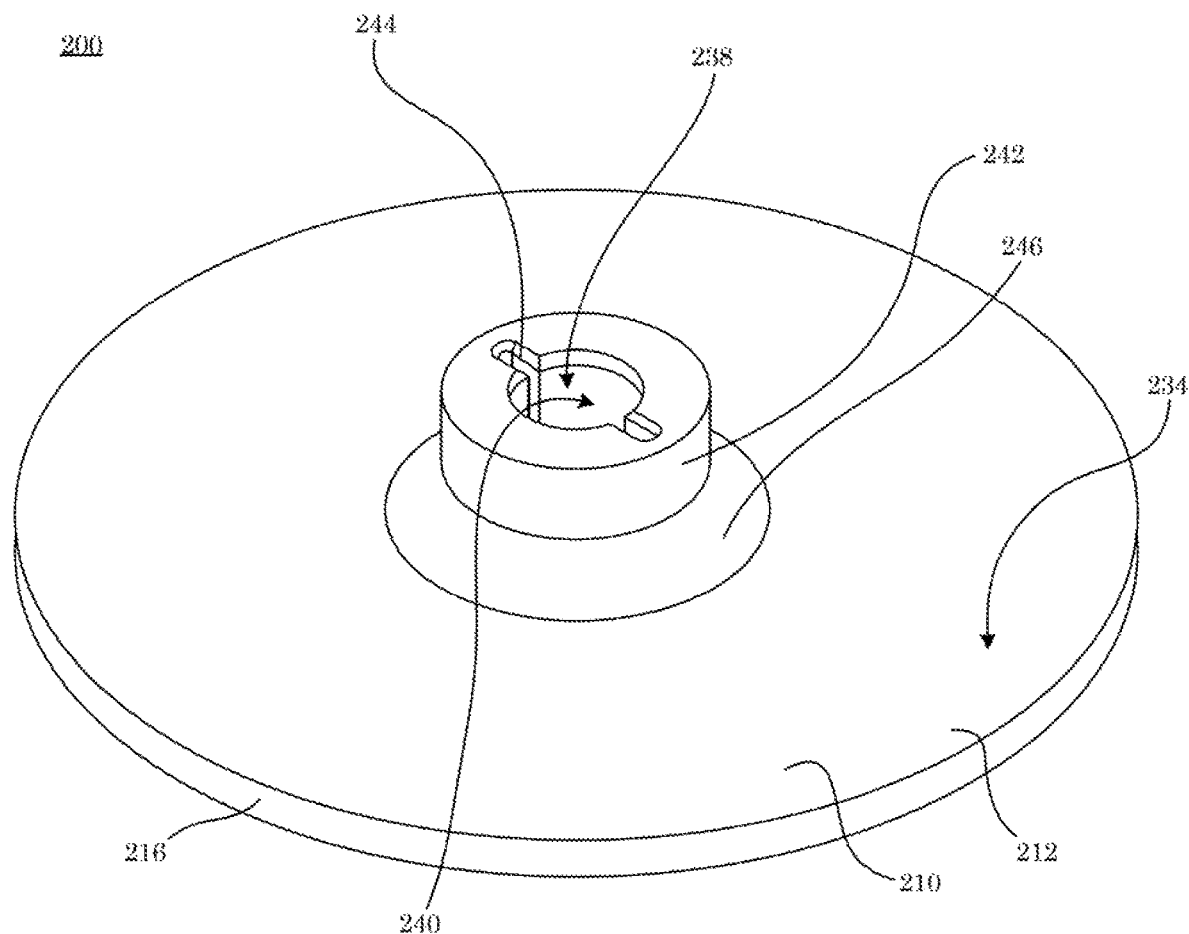
FIG. 2 shows a perspective view of a spinner-side surface of the non-vacuum, non-contact spinner wafer chuck shown in FIG. 1.
Figure 3:
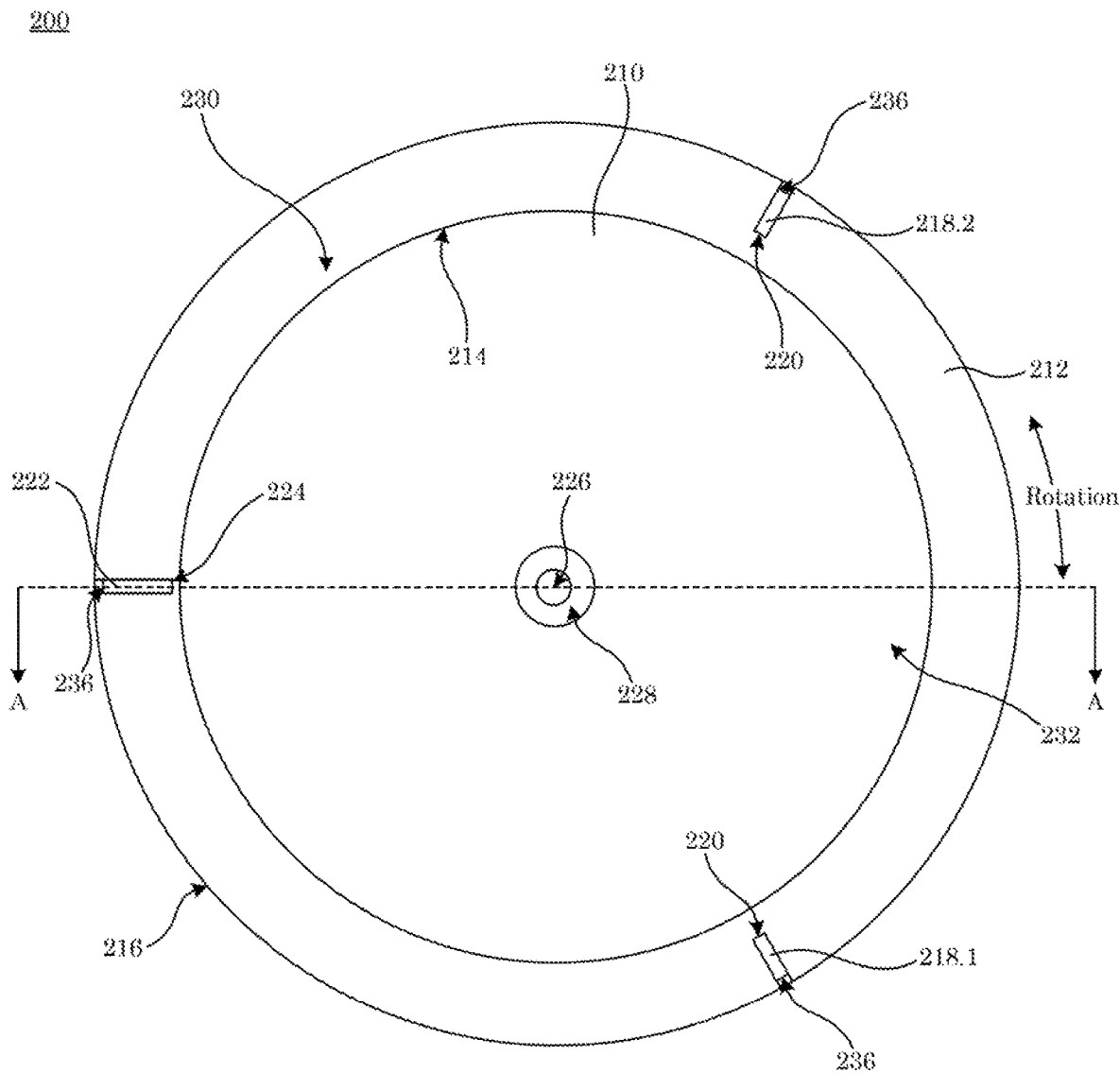
FIG. 3 shows a plan view of the wafer-side surface of the non-vacuum, non-contact spinner wafer chuck shown in FIG. 1.
Figure 4:
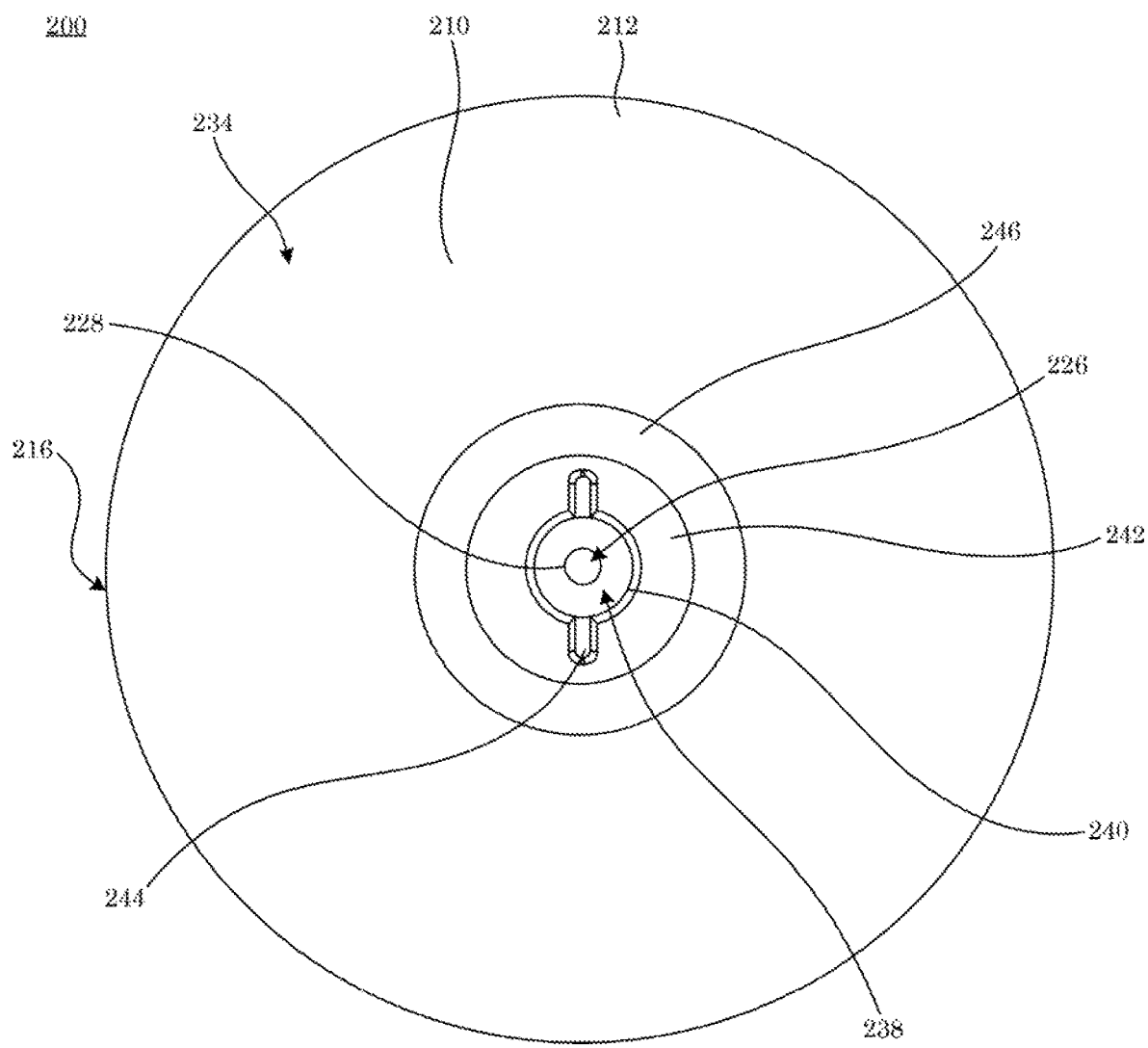
FIG. 4 shows a plan view of the spinner-side surface of the non-vacuum, non-contact spinner wafer chuck shown in FIG. 1.
Figure 5:
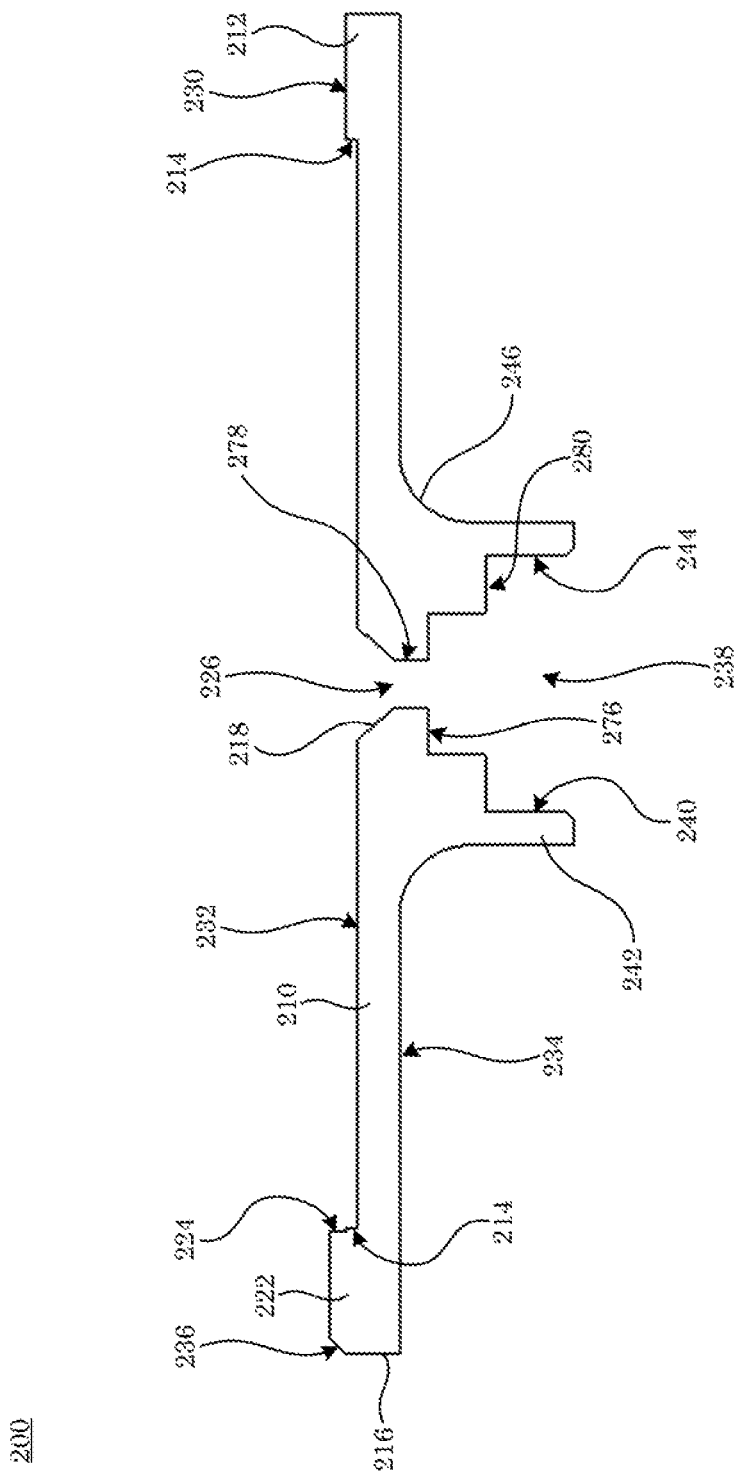
FIG. 5 shows a cross-section along line A-A of the non-vacuum, non-contact spinner wafer chuck shown in FIG. 1.
Figure 6:
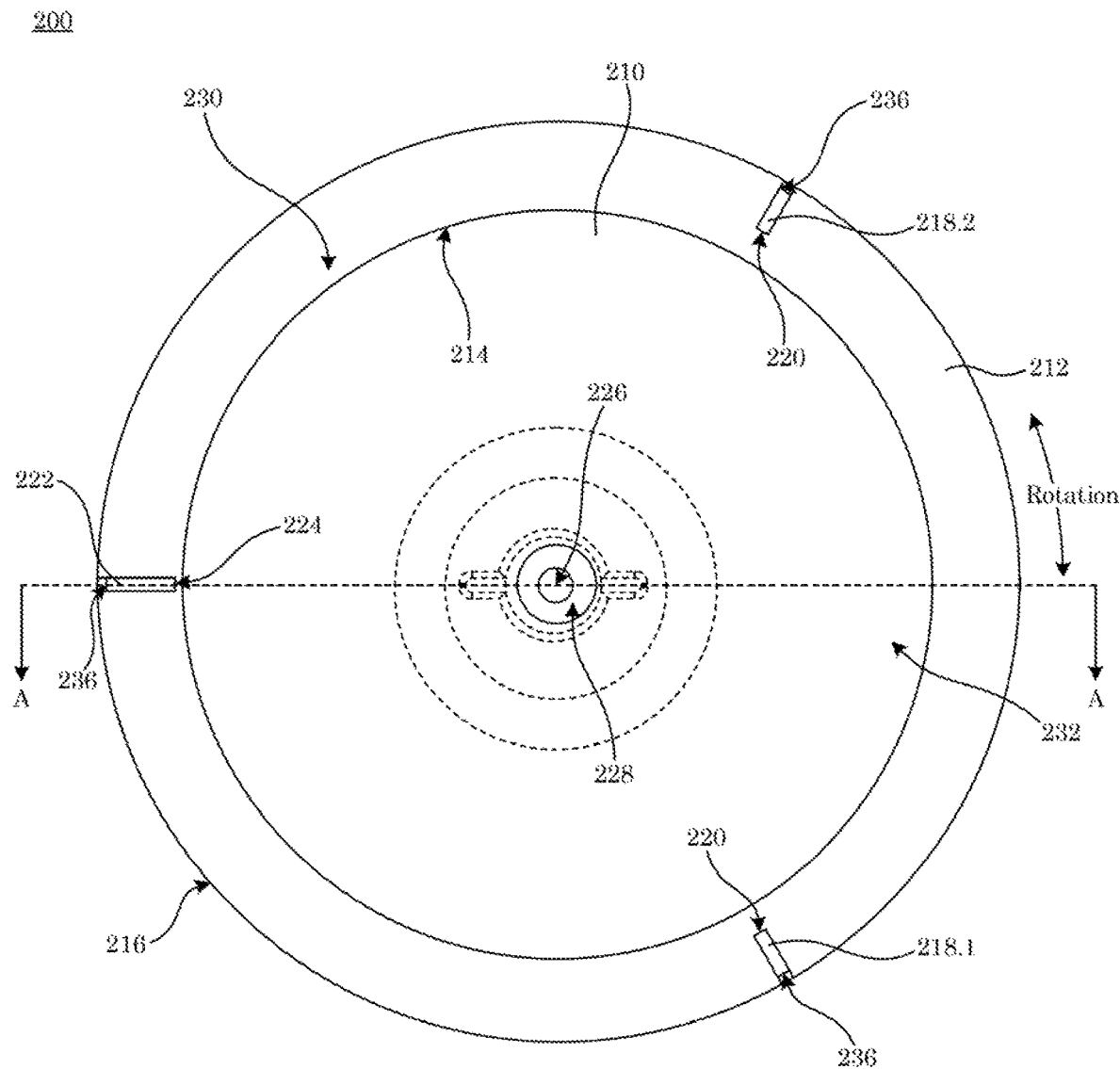
FIG. 6 shows the plan view shown in FIG. 3 with dotted lines for features from the spinner-side surface.
Figure 7:
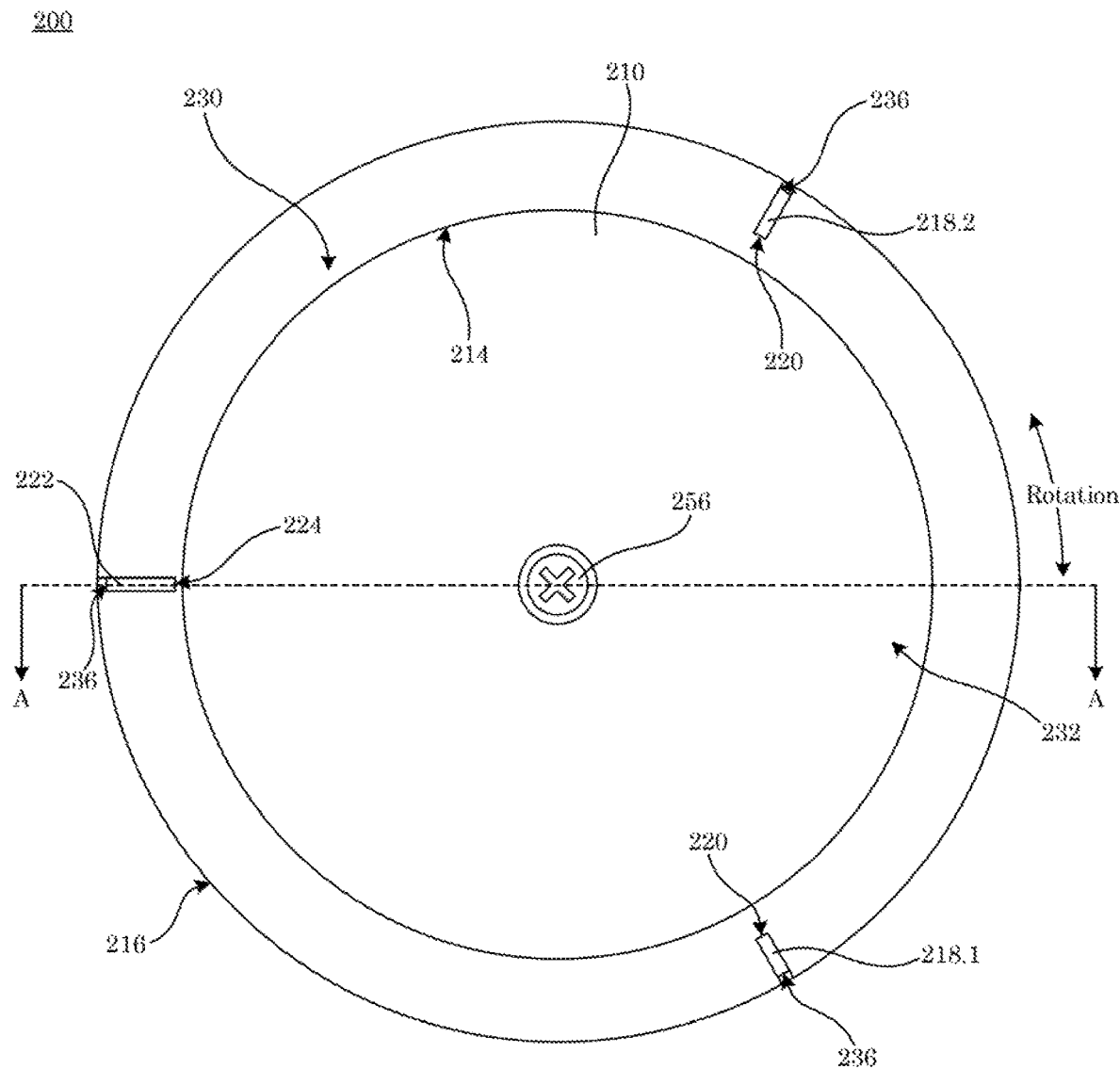
FIG. 7 shows a fastener disposed in a fastener receiver of a non-vacuum, non-contact spinner wafer chuck.
Figure 8:
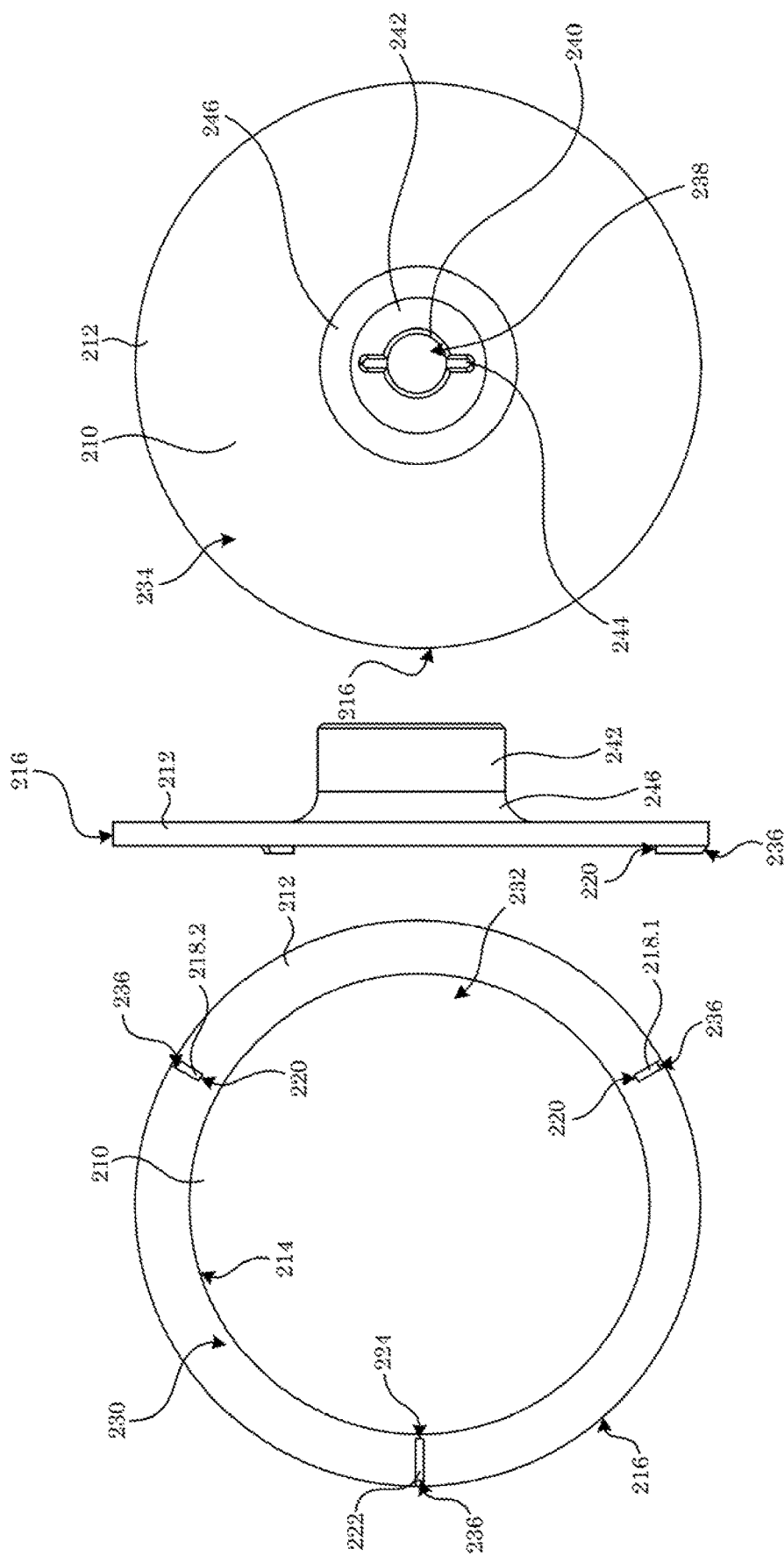
FIG. 8 shows, from left to right, a wafer-side plan view of a non-vacuum, non-contact spinner wafer chuck; a side view plan view of the non-vacuum, non-contact spinner wafer chuck; and a spinner-side plan view of the non-vacuum, non-contact spinner wafer chuck.
Figure 9:
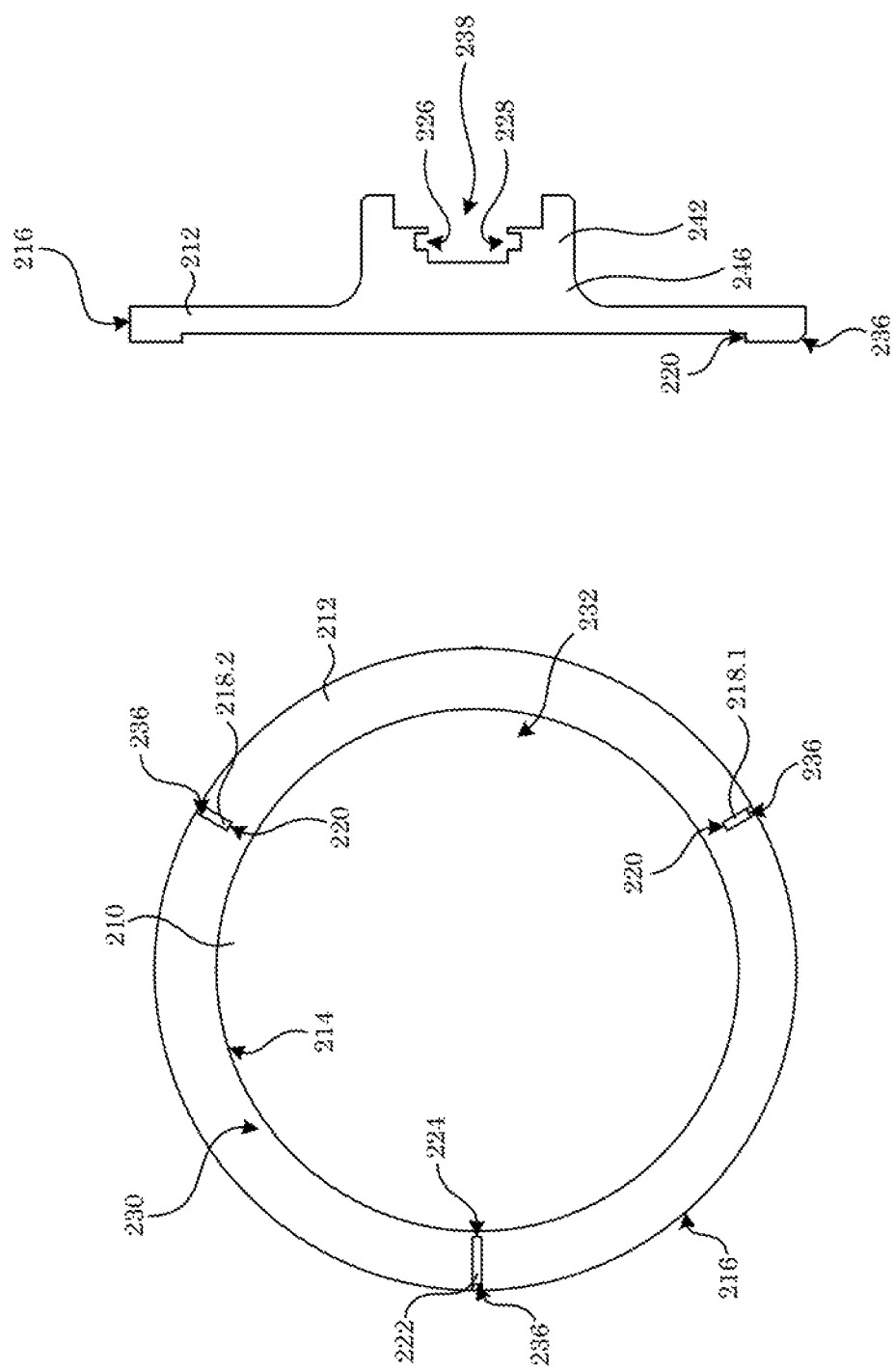
FIG. 9 shows, from left to right, a wafer-side plan view of the non-vacuum, non-contact spinner wafer chuck shown in FIG. 8; and a cross-section of the non-vacuum, non-contact spinner wafer chuck.
Figure 10:
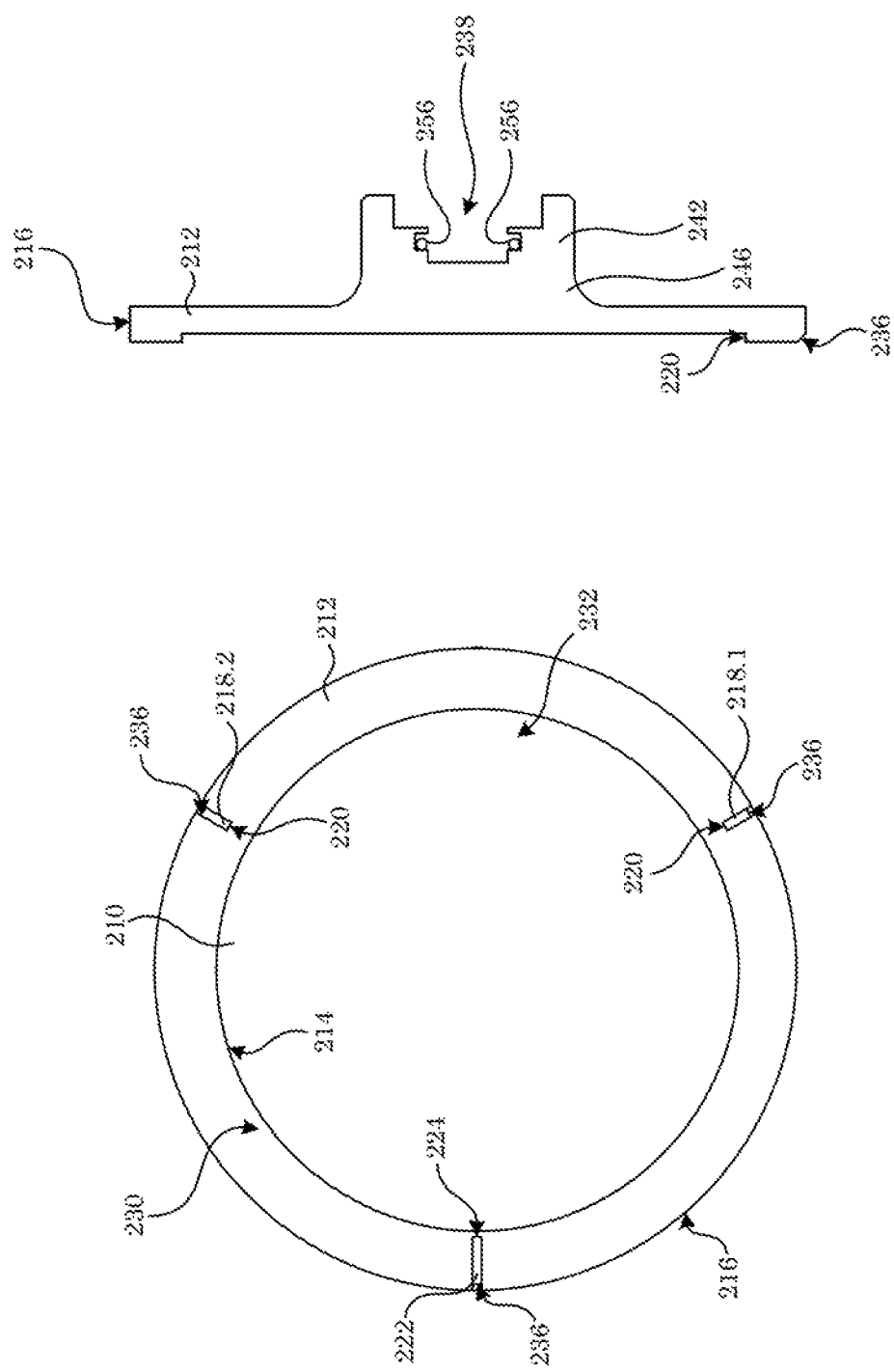
FIG. 10 shows, from left to right, a wafer-side plan view of the non-vacuum, non-contact spinner wafer chuck shown in FIG. 8; and an O-ring disposed on the non-vacuum, non-contact spinner wafer chuck.
Figure 11:
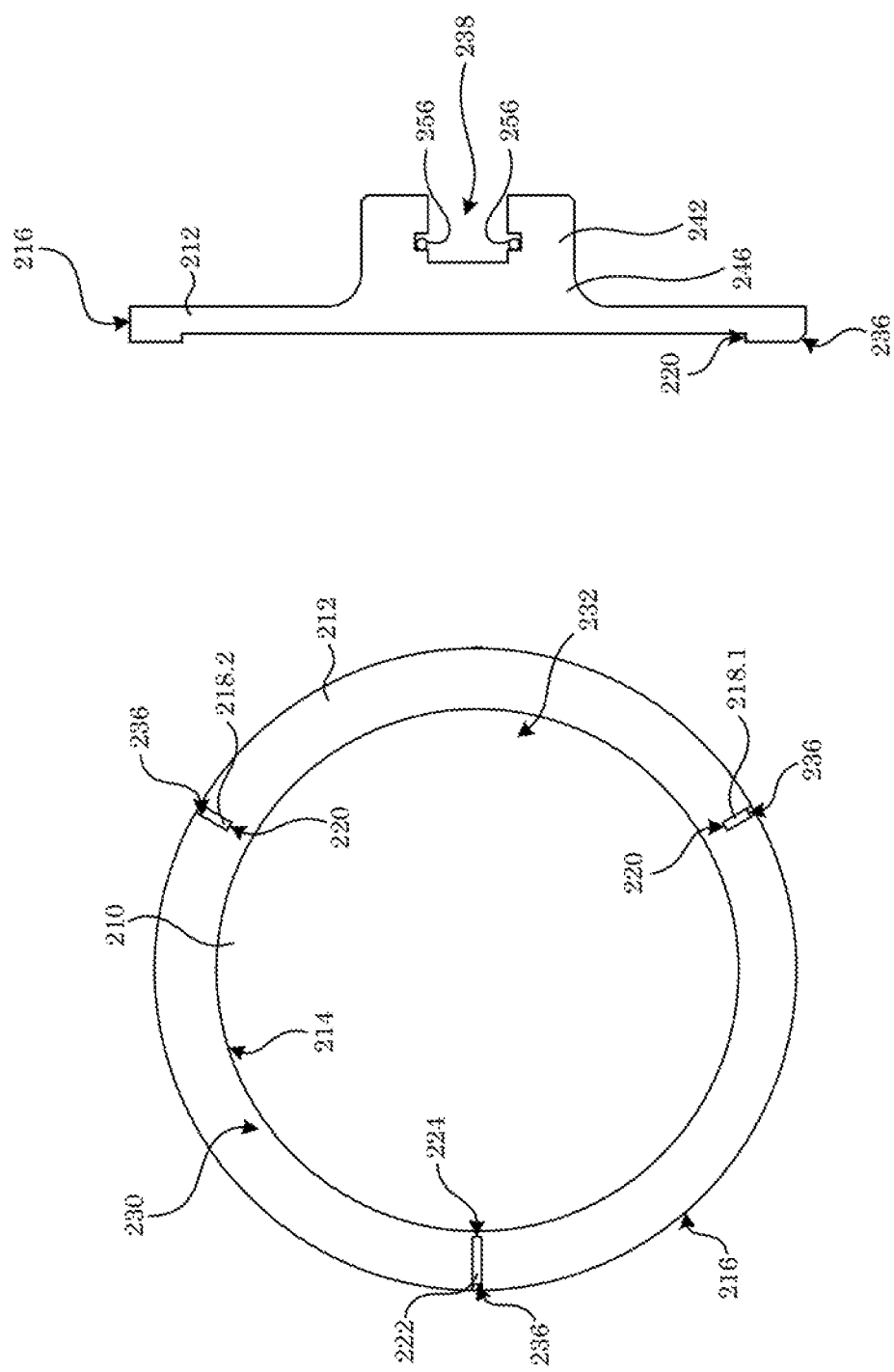
FIG. 11 shows, from left to right, a wafer-side plan view of the non-vacuum, non-contact spinner wafer chuck shown in FIG. 8; and an O-ring disposed on the non-vacuum, non-contact spinner wafer chuck.
Figure 12:
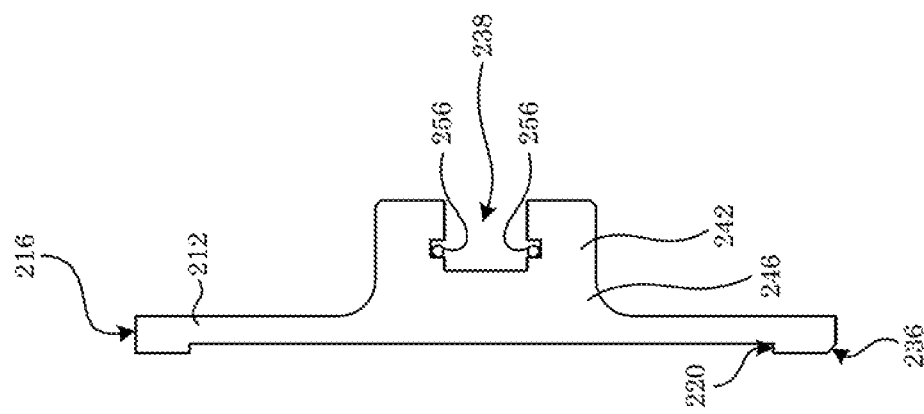
FIG. 12 shows, from left to right, a cross-section of the non-vacuum, non-contact spinner wafer chuck shown in FIG. 8 in an absence of O-ring and with an O-ring disposed on the non-vacuum, non-contact spinner wafer chuck.
Figure 12:
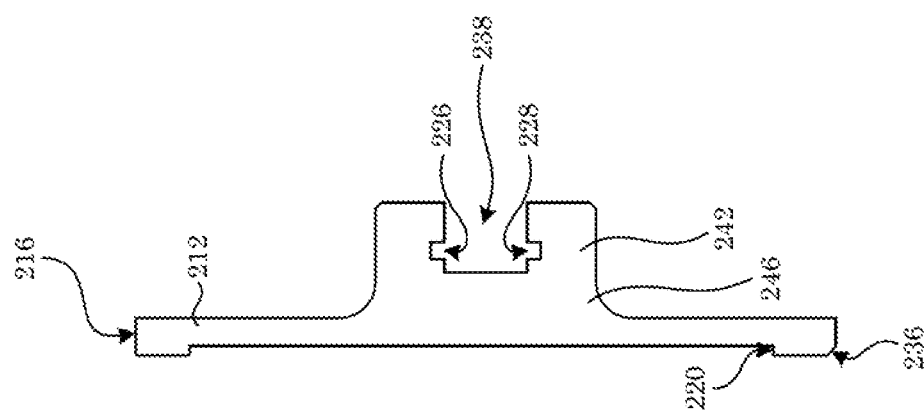
Figure 13:
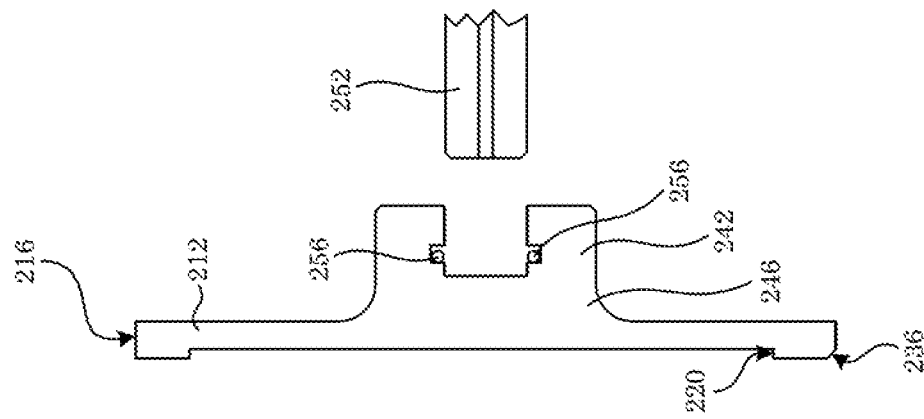
FIG. 13 shows, from left to right, a cross-section of the non-vacuum, non-contact spinner wafer chuck shown in FIG. 8 disposed on a spinner such that an O-ring engages the spinner; and absence of the spinner in a spinner engager of the non-vacuum, non-contact spinner wafer chuck.
Figure 13:
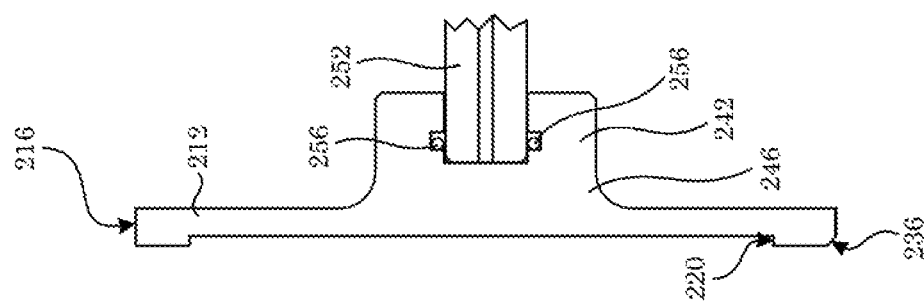
Figure 14:
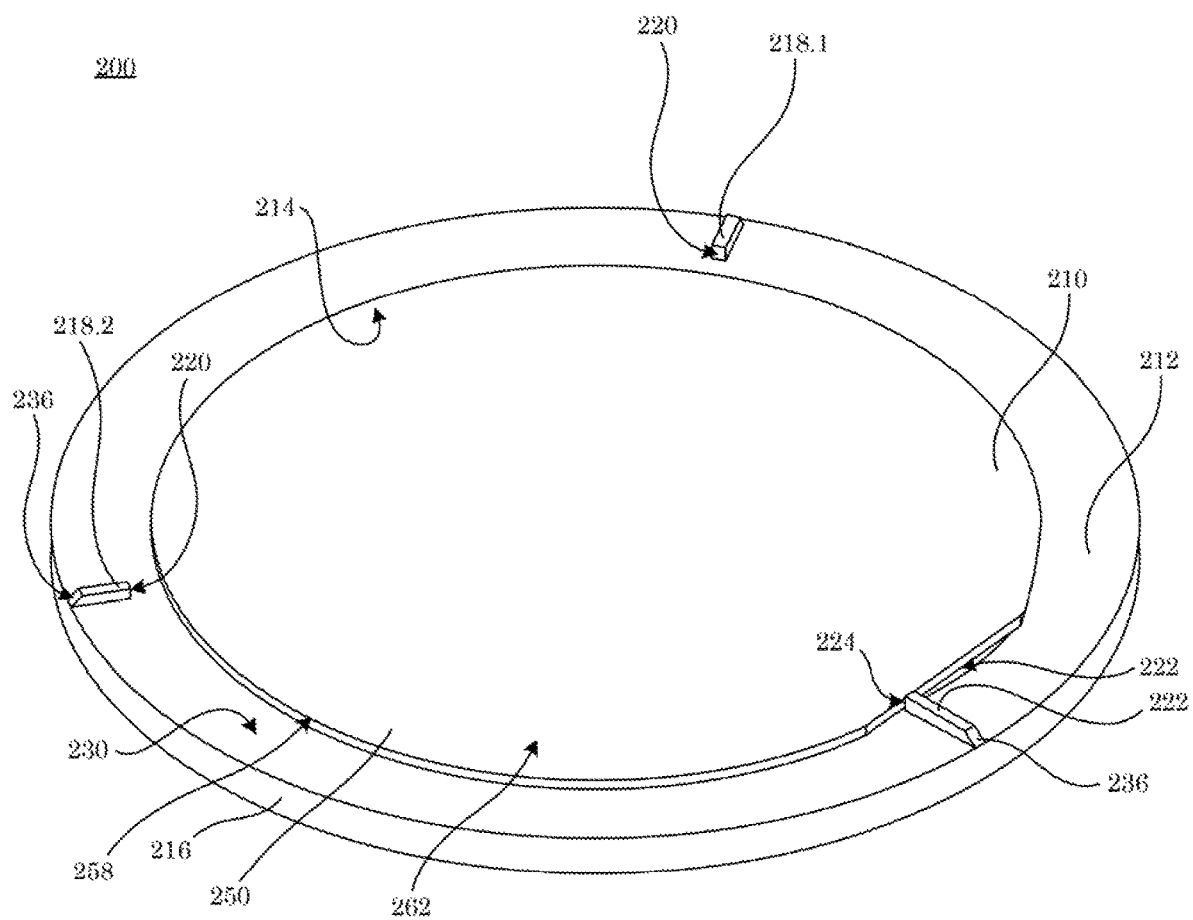
FIG. 14 shows a perspective view of a wafer disposed on a spinner-side surface of a non-vacuum, non-contact spinner wafer chuck.
Figure 15:
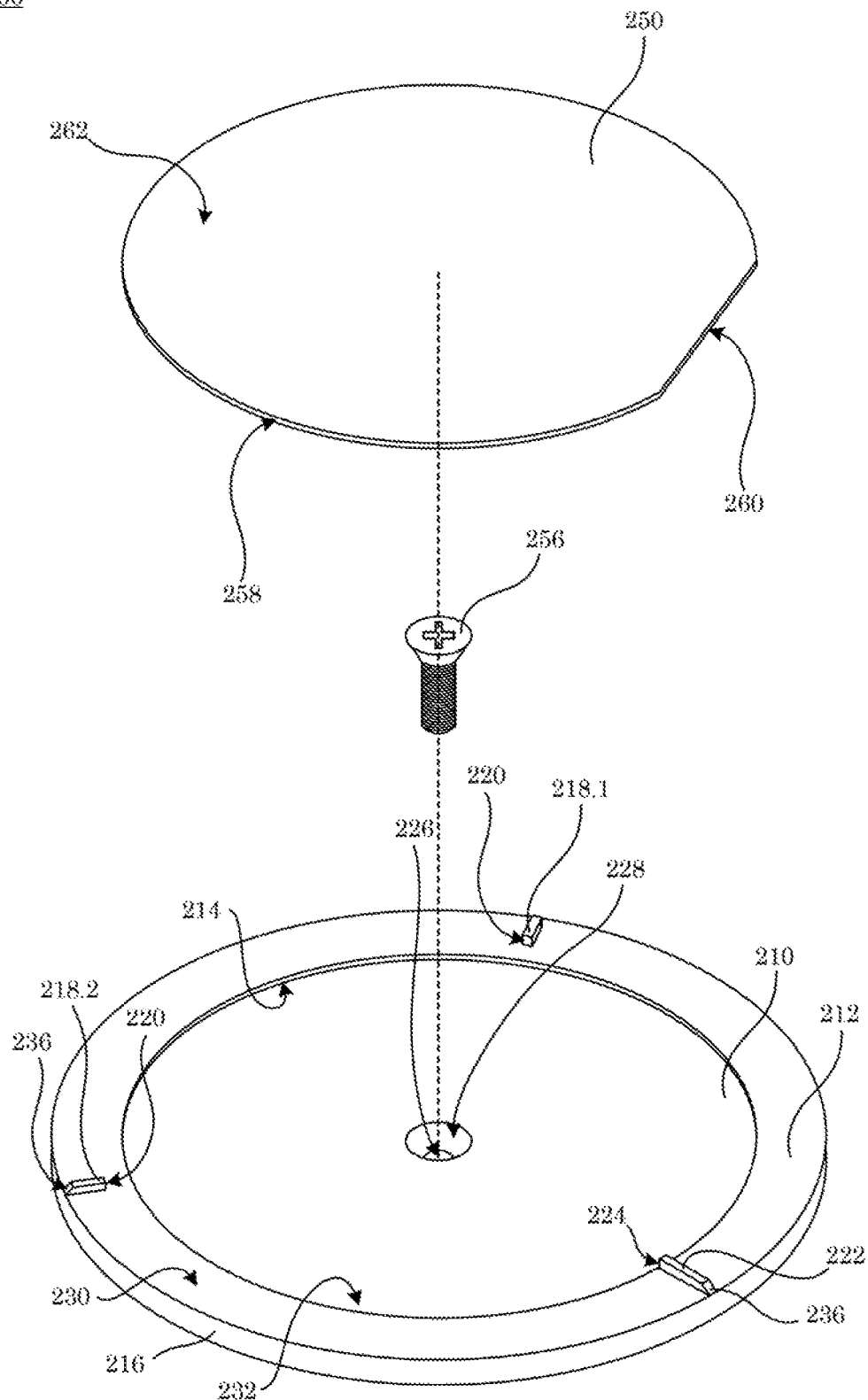
FIG. 15 shows an exploded view of the non-vacuum, non-contact spinner wafer chuck shown in FIG. 14.
Figure 16:
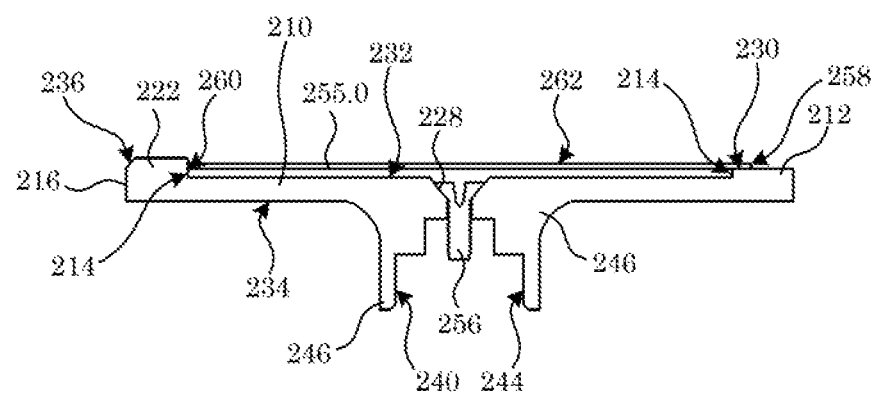
FIG. 16 shows a plan view (panel B) of the non-vacuum, non-contact spinner wafer chuck shown in FIG. 14 and a shows (panel A) a cross-section along line A-A shown in panel B.
Figure 16:
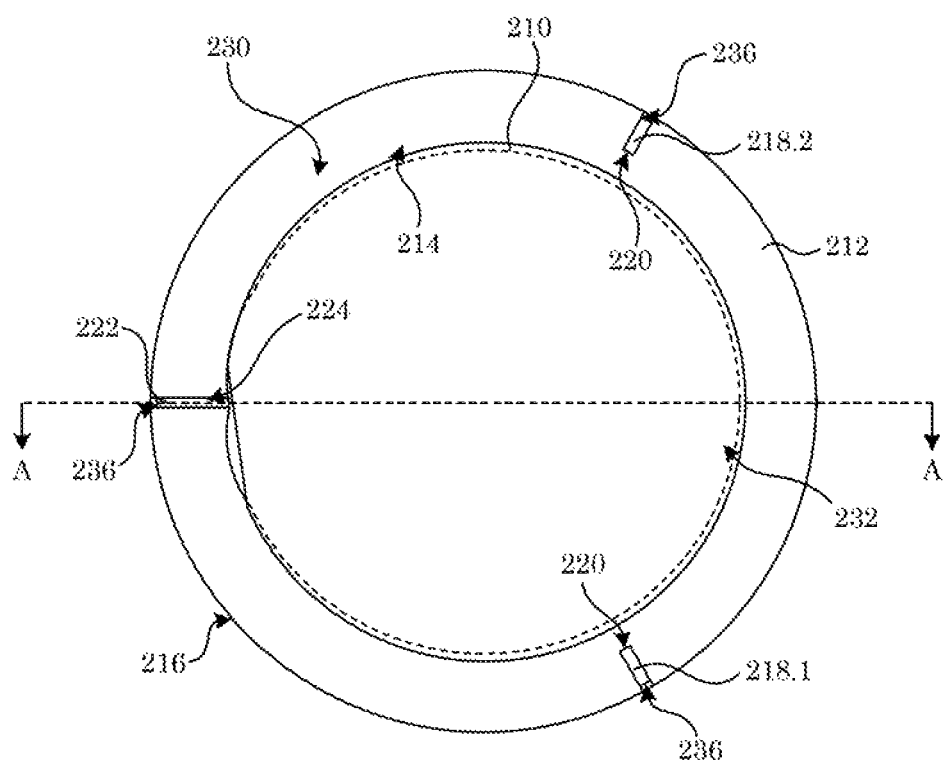

A detailed description of one or more embodiments is presented herein by way of exemplification and not limitation.

A wafer processing machine includes a spinner that rotates a wafer during application of a photoresist to a wafer as part of a photo lithography process. Conventional vacuum chucks for wafer for disposal of the wafer in the wafer processing machine use vacuum to hold the wafer to the conventional vacuum chuck that involves technical limitations. It has been discovered that a non-vacuum, non-contact spinner wafer chuck and processes herein overcome such technical limitations of the conventional vacuum chuck. In particular, the vacuum can leak on the conventional vacuum chuck, but the non-vacuum, non-contact spinner wafer chuck herein retains a wafer without applying vacuum to the wafer through the non-vacuum, non-contact spinner wafer chuck. With a conventional vacuum chuck, a user centers the wafer on the conventional vacuum chuck, but the non-vacuum, non-contact spinner wafer chuck herein self-centers the chuck in an absence of the user centering the wafer thereon. Moreover, conventional vacuum chucks can scratch a mounting surface of the wafer, but the non-vacuum, non-contact spinner wafer chuck herein prevents scratches to the wafer. The non-vacuum, non-contact spinner wafer chuck herein accommodates wafers having a range of diameters due to presence of a plurality of cams in the non-vacuum, non-contact spinner wafer chuck.

Advantageously, the non-vacuum, non-contact spinner wafer chuck provides non-vacuum, non-central (i.e., peripherally distributed) contact engagement with a wafer disposed thereon. Beneficially and unexpectedly, the non-vacuum, non-contact spinner wafer overcomes technical limitation of conventional vacuum chucks including problems getting a sufficient vacuum seal, contamination from the conventional vacuum chuck on a wafer that can be a process failure many steps into a multistep process, and destruction of thin delicate wafers by the conventional vacuum chuck. The non-vacuum, non-contact spinner wafer chuck holds the wafer at edges of the wafer and maintains a rotational geometry of the wafer in a fixed position on the non-vacuum, non-contact spinner wafer chuck by the cams that are selectively arranged on the non-vacuum, non-contact spinner wafer chuck. An index cam is disposed radially closer to a center than engagement cams so that the index cam locks the wafer into position on the non-vacuum, non-contact spinner wafer chuck via an index face of the index cam engaging an index edge of the wafer. The non-vacuum, non-contact spinner wafer chuck provides uniform coating spins of the wafer in the wafer processing machine in an absence of contamination or scratches to a spinner-side of the wafer.

Non-vacuum, non-contact spinner wafer chuck 200 receives and indexes wafer 250. In an embodiment, with reference to FIG. 1, FIG. 2, FIG. 3, FIG. 4, FIG. 5, FIG. 6, FIG. 7, FIG. 8, FIG. 9, FIG. 10, FIG. 11, FIG. 12, FIG. 13, and FIG. 25, non-vacuum, non-contact spinner wafer chuck 200 includes: non-vacuum, non-contact spinner wafer chuck 200 for receiving and indexing wafer 250, non-vacuum, non-contact spinner wafer chuck 200 including: basal member 210 including: wafer-side surface 232; and spinner-side surface 234 opposing wafer-side surface 232; fastener receiver 226 disposed in basal member 210 and bounded by receiver wall 228 and that receives fastener 256 that fastens non-vacuum, non-contact spinner wafer chuck 200 to wafer processing machine 254; chuck collar 212 disposed on basal member 210 and including: inner collar wall 214 that intersects basal member 210 at wafer-side surface 232; and outer collar wall 216 opposing inner collar wall 214; and engagement surface 230 that: receives and engages wafer 250; and is interposed between inner collar wall 214 and outer collar wall 216; wafer engagement cam 218 disposed on chuck collar 212 and including: engagement face 220 that faces toward fastener receiver 226 and that engages wafer 250; index cam 222 disposed on chuck collar 212 and including: index face 224 that faces toward fastener receiver 226 and that engages wafer 250; and spinner engager 242 disposed on spinner-side surface 234 of basal member 210 and including: spinner arm receiver 238 bounded by wall 240 and that receives spinner 252 of wafer processing machine 254, wherein wafer engagement cam 218 and index cam 222 engage wafer 250 and maintains an orientation of wafer 250 with respect to index cam 222 in response to rotation of wafer 250 relative to non-vacuum, non-contact spinner wafer chuck 200. Transition 246 optionally can be disposed on spinner-side surface 234 of basal member 210, wherein transition 246 is interposed between basal member 210 and spinner engager 242. Slot receiver 244 is disposed proximate to spinner arm receiver 238 and receives part of spinner 252 to rotate non-vacuum, non-contact spinner wafer chuck 200 relative to wafer processing machine 254. Index cam 222 also can include cam outer surface 236 opposingly disposed from engagement face 220, wherein cam outer surface 236 provides mechanical stability to non-vacuum, non-contact spinner wafer chuck 200 during rotation of non-vacuum, non-contact spinner wafer chuck 200 relative to wafer processing machine 254. Cam outer surface 236 is opposingly disposed from engagement face 220 and that mechanical stability to non-vacuum, non-contact spinner wafer chuck 200 during rotation of non-vacuum, non-contact spinner wafer chuck 200 relative to wafer processing machine 254. Chuck collar 212 can include protuberance platform 248 disposed on basal member 210 to receive wafer 250, wherein protuberance platform 248 is interposed between basal member 210 and index cam 222 such that protuberance platform 248 protrudes from inner collar wall 214 toward fastener receiver 226.

Non-vacuum, non-contact spinner wafer chuck 200 can include basal member 210 that can include a material that can be formed to make basal member 210. Such material can be subjected to additive or subtractive manufacturing, e.g., computer numerical control (CNC) machining to form non-vacuum, non-contact spinner wafer chuck 200 as a solid monolithic article. The materials can be metal, polymer, glass, ceramic, and the like. In an embodiment, the material is an acetal homopolymer (commercially available as DELRIN, e.g., DELRIN-150). The acetal homopolymer can have a density that is less than an aluminum alloy and that provides a selected mass for non-vacuum, non-contact spinner wafer chuck 200 and that reduces stain on a motor that spins spinner 252 of wafer processing machine 254. It is contemplated that material of construction of non-vacuum, non-contact spinner wafer chuck 200 can be formed, machined, or additively fabricated, or injection molded for compatibility with processing wafer 250 by wafer processing machine 254. Components for formation of basal member 210 can be pressed together from different materials to form basal member 210 alone or with other elements of non-vacuum, non-contact spinner wafer chuck 200. Materials of construction of non-vacuum, non-contact spinner wafer chuck 200 are stable and chemically compatible for processing wafer 250 with wafer processing machine 254 so that non-vacuum, non-contact spinner wafer chuck 200 is mechanically balanced about a center of rotation. e.g., a center of mass or rotational axis, dimensionally stable at a selected angular velocity of spinner 252 that can be greater than 2000 RPM. A thickness of basal member 210 can be, e.g., from 1 mm to 30 mm. In an embodiment, basal member 210 includes a 98 mm diameter; a thickness from engagement surface 230 to wafer-side surface 232 that is be 1 mm; and a thickness from wafer-side surface 232 to spinner-side surface 234 that can be from 1 mm to 30 mm, e.g., 3.8 mm.

Chuck collar 212 is provided to engage a planar surface of wafer 250. Exemplary chuck collars 212 can include a distance from inner collar wall 214 to outer collar wall 216 that is, e.g., about 11 mm. A thickness (i.e., a length orthogonal to basal member 210) of chuck collar 212 can be from 2 mm to 20 mm. A width (i.e., a length radial from basal member 210 from inner collar wall 214 to outer collar wall 216) of chuck collar 212 can be from 2 mm to 20 mm.

Wafer engagement cam 218 includes cam outer surface 236 disposed at an outer periphery of wafer engagement cam 218 proximate to outer collar wall 216. Cam outer surface 236 is arranged at an acute angle with respect to engagement surface 230 of chuck collar 212 to reduce air vortices and turbulence that could result in wafer 250 being displaced from engagement with engagement face 220 or index face 224. An acute angle can be from 90 degrees to −45 degrees. In an embodiment, the acute angle between cam outer surface 236 and outer collar wall 216 is 45 degree. Engagement face 220 is disposed at an inner periphery of wafer engagement cam 218 distal to outer collar wall 216 and proximate to inner collar wall 214 to engage round edge 258 of wafer 250. A thickness along a direction orthogonal to chuck collar 212 of wafer engagement cam 218 can be from 2 mm to 30 mm. A length of wafer engagement cam 218 radial to receiver wall 228 from engagement face 220 to cam outer surface 236 can be from 1 mm to 30 mm. Moreover, wafer engagement cam 218 engages round edge 258 on wafer 250. This engagement allows round edge 258 of wafer 250 to engage engagement face 220 on wafer engagement cam 218. Gravity aids in engagement between wafer 250 and surface 230.

In an embodiment, wafer engagement cam 218 includes a distance from fastener receiver 226 to engagement face 220 that is 50 mm, and a distance of engagement face 220 to cam outer surface 236 that is 8.7 mm at a top surface of engagement cam 218 and that slopes at a 45-degree angle to meet outer collar wall 216.

Index cam 222 includes cam outer surface 236 disposed at an outer periphery of wafer engagement cam 218 proximate to outer collar wall 216. Cam outer surface 236 is arranged at an acute angle with respect to engagement surface 230 of chuck collar 212 Cam outer surface 236 is arranged at an acute angle with respect to engagement surface 230 of chuck collar 212 to reduce air vortices and turbulence that could result in the sample 250, becoming displaced from the engagement of engagement face 220 and index face 224. The acute angle can be from 90 degrees to 45 degrees. The acute angle can be 45 degree from cam outer surface 236 to outer collar wall 216. Index face 224 is disposed at an inner periphery of wafer engagement cam 218 distal to outer collar wall 216 and proximate to inner collar wall 214 to engage index edge 260 of wafer 250. A thickness along a direction orthogonal to chuck collar 212 of index cam 222 can be from 3 mm to 30 mm, and thickness from chuck collar 212 to index cam 222 can be from 3 mm to 30 mm, e.g., about 6.4 mm. A length of index cam 222 radial to receiver wall 228 from index face 224 to cam outer surface 236 can be from 30 mm to 300 mm. A width (i.e., a length parallel to index face 224 and engagement surface 230) of index cam 222 can be from 4 mm to 30 mm. Moreover, index cam 222 engages index edge 260 of wafer 250. This engagement allows round edge 258 of wafer 250 to engage engagement face 220 of wafer engagement cam 218. Gravity aids in engagement with wafer 250 and engagement surface 230. As wafer processing machine 254 begins rotating spinner 252, index edge 260 engages with index face 224.

In an embodiment, index cam 222 engages the index edge of wafer 250 so that, upon engagement, wafer 250 and non-vacuum, non-contact spinner wafer chuck 200 rotate synchronously at a same angular velocity without wafer 250 slipping with respect to wafer-side face 232. A size of index cam 222 can be selected based on a thickness of wafer 250 and can be from 5 mm to 1000 mm, e.g., about 49 mm from center of fastener receiver 226 to index face 224.

In an embodiment, with reference to FIG. 1, FIG. 7, FIG. 14, FIG. 15, and FIG. 16, fastener receiver 226 is a blind hole or through hole bounded by receiver wall 228 disposed centrally in basal member 210 to receive fastener 256 so that non-vacuum, non-contact spinner wafer chuck 200 can be disposed on spinner 252. In some embodiment, as shown in FIG. 8, FIG. 9, FIG. 10, FIG. 11, FIG. 12, FIG. 13), fastener receiver 226 is an O-ring gland to receive an O-ring, which can form a compression seal in combination with spinner 252 of wafer processing machine 254. Receiver wall 228 can be arranged at an acute angle or orthogonal to basal member 210 to engage fastener 256 so that fastener 256 seats against receiver wall 228. Fastener 256 can be a screw, bolt, rivet, cotter pin, dowel, O-ring (as shown in FIG. 10, FIG. 11, FIG. 12, FIG. 13), and the like.

Spinner arm receiver 238 and slot receiver 244 are bounded by wall 240 in an interior of spinner engager 242 to engage spinner 252 of wafer processing machine 254 so that wafer 250 and non-vacuum, non-contact spinner wafer chuck 200 rotate at a selected rate of spinner 252. A size or shape of spinner arm receiver 238 and slot receiver 244 are selected for acceptance and engagement of spinner 252. Spinner engager 242 can include components to receive spinner 252 and can have an arbitrary shape to receive and engage spinner 252 so that spinner 252 and non-vacuum, non-contact spinner wafer chuck 200 synchronously rotate at the same angular velocity without non-vacuum, non-contact spinner wafer chuck 200 slipping on spinner 252 or becoming disengaged with spinner 252. A length of spinner engager 242 orthogonal to spinner-side surface 234 can be selected to receive spinner 252 so that non-vacuum, non-contact spinner wafer chuck 200 can rotate with spinner 252 without physically contacting other parts of wafer processing machine 254 that are meant to be free from rotation of non-vacuum, non-contact spinner wafer chuck 200 on spinner 252 so that rotation of non-vacuum, non-contact spinner wafer chuck 200 on spinner 252 is not hindered by stationery parts of wafer processing machine 254. In an embodiment, spinner engager 242 includes a slot receiver 244 that can be sufficiently open (e.g., having a 2 mm width) with an edge chamfer angle to allow pin engagement, wherein slot receiver 244 receives spinner 252 of wafer processing machine 254.

Transition 246 can be disposed on basal member 210 at spinner-side surface 234 to smoothly transition spinner-side surface 234 to spinner engager 242 in contemplation of flow dynamics of gas around these features to decrease drag and turbulence on non-vacuum, non-contact spinner wafer chuck 200 during operation of wafer processing machine 254. A size or shape of transition 246 can be selected to minimize drag or turbulence of non-vacuum, non-contact spinner wafer chuck 200 and provides stable support of non-vacuum, non-contact spinner wafer chuck 200 by connecting spinner-side surface 234 to spinner engager 242 in a structurally stable. A radius of curvature can be from 5 mm to 1000 mm, and specifically from 5 mm to 100 mm, e.g., about 21 mm.

Figure 17:
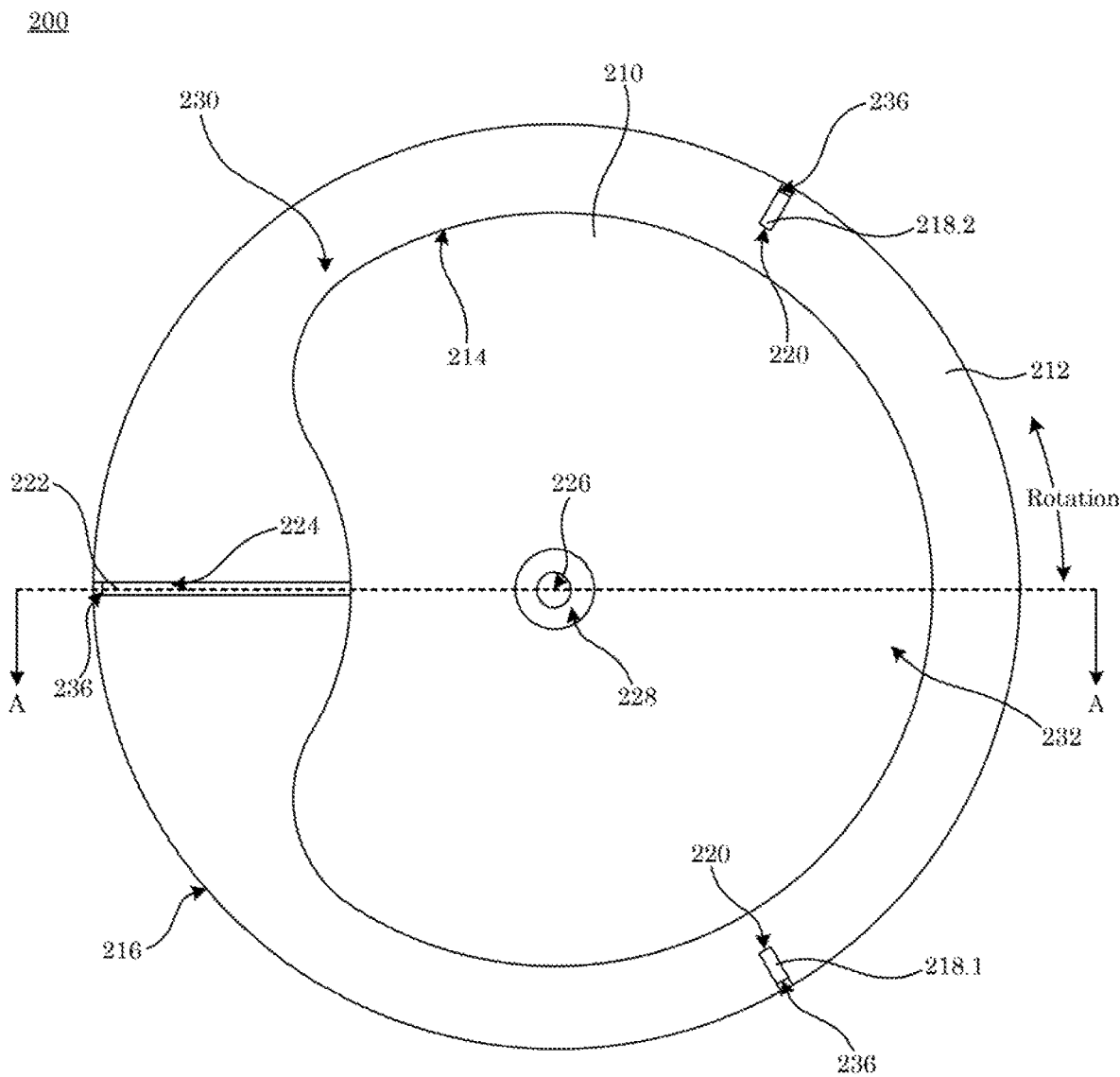
FIG. 17 shows a plan view of a wafer-side surface of the non-vacuum, non-contact spinner wafer chuck with a protuberance platform.
Figure 18:
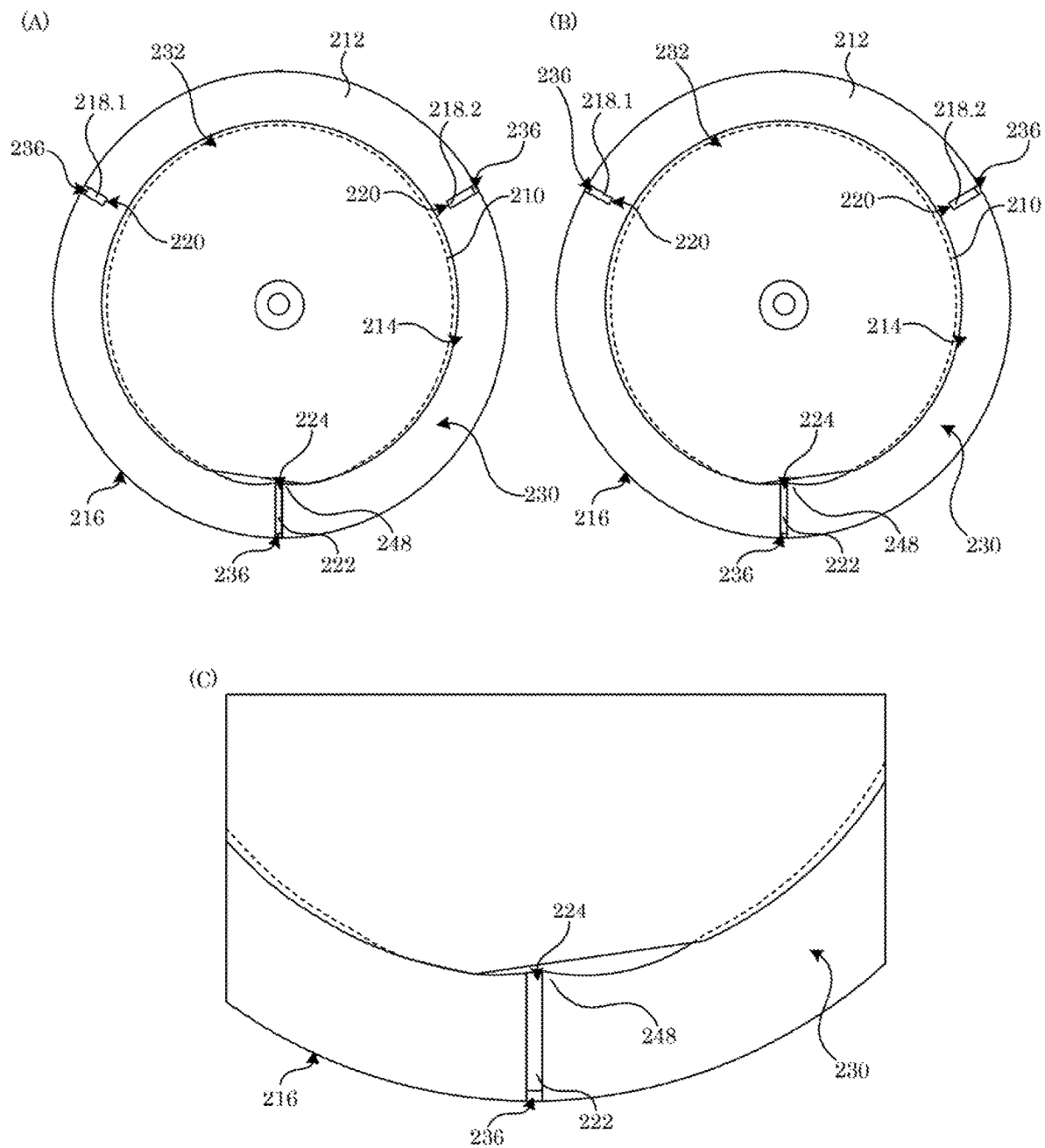
FIG. 18 shows (panel A) a wafer disposed at a fixed orientation on a non-vacuum, non-contact spinner wafer chuck due to contact between a straight edge of the wafer and an index cam of the non-vacuum, non-contact spinner wafer chuck in response to clockwise rotation of the non-vacuum, non-contact spinner wafer chuck; (panel B) a wafer disposed at a fixed orientation on a non-vacuum, non-contact spinner wafer chuck due to contact between a straight edge of the wafer and an index cam of the non-vacuum, non-contact spinner wafer chuck in response to counter-clockwise rotation of the non-vacuum, non-contact spinner wafer chuck; and (panel C) an enlarged view of a portion of the wafer and the non-vacuum, non-contact spinner wafer chuck shown in panel B.
Figure 19:
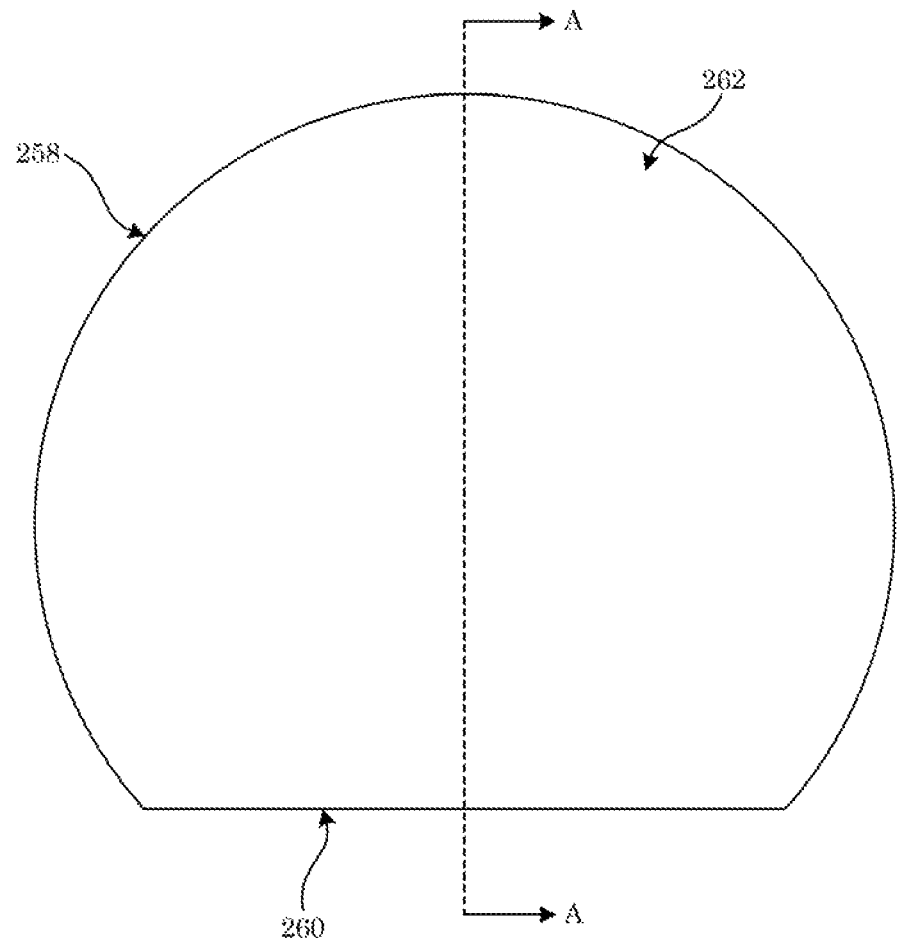
FIG. 19 shows (panel A) a plan view of a wafer and (panel B) a cross-section the wafer along line A-A shown in panel B.
Figure 19:
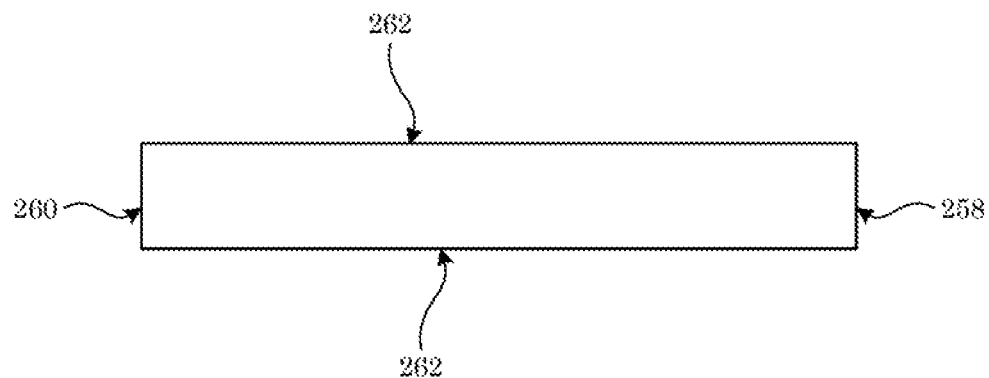
Figure 20:
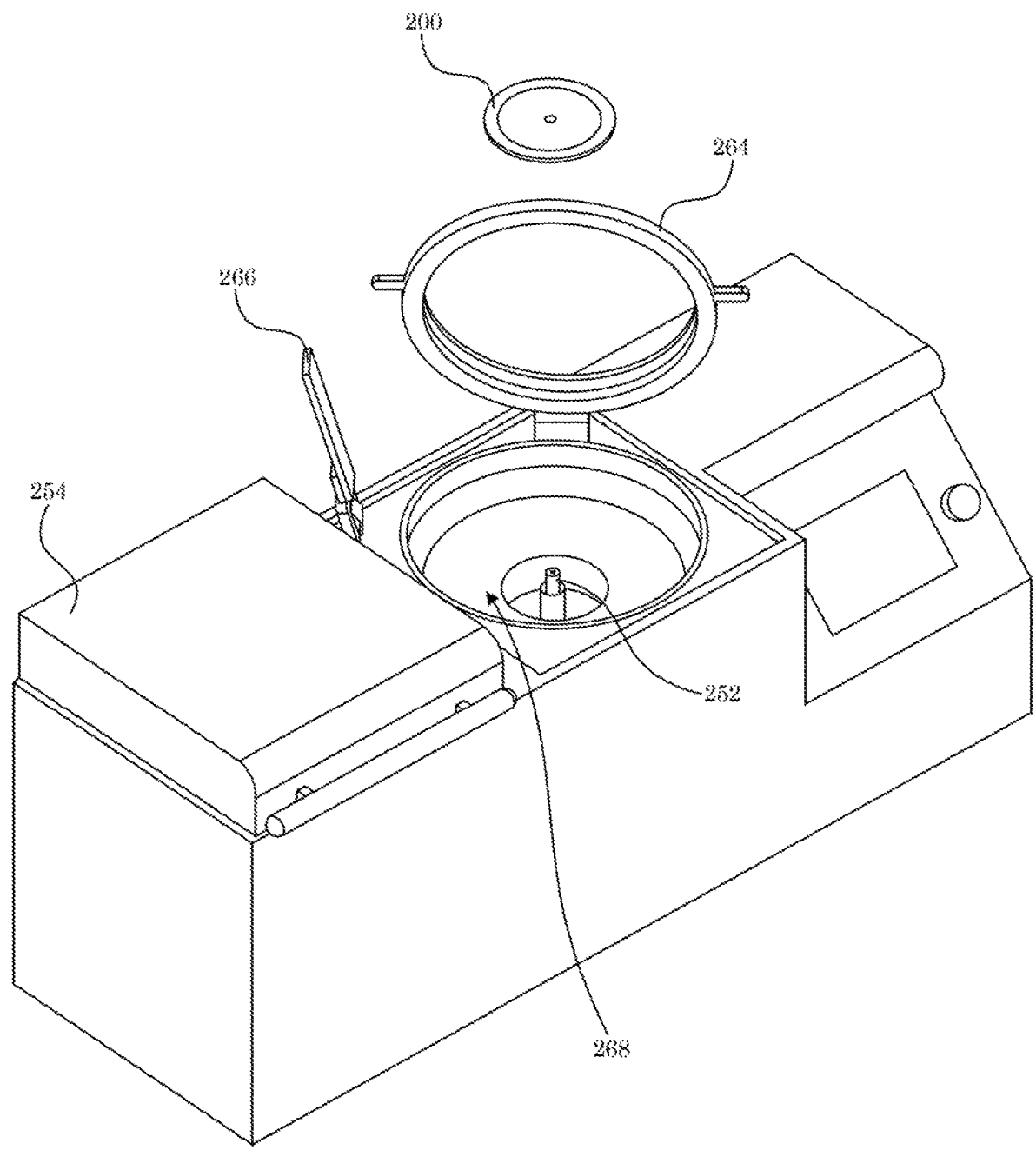
FIG. 20 shows a wafer processing machine and a non-vacuum, non-contact spinner wafer chuck.
Figure 21:
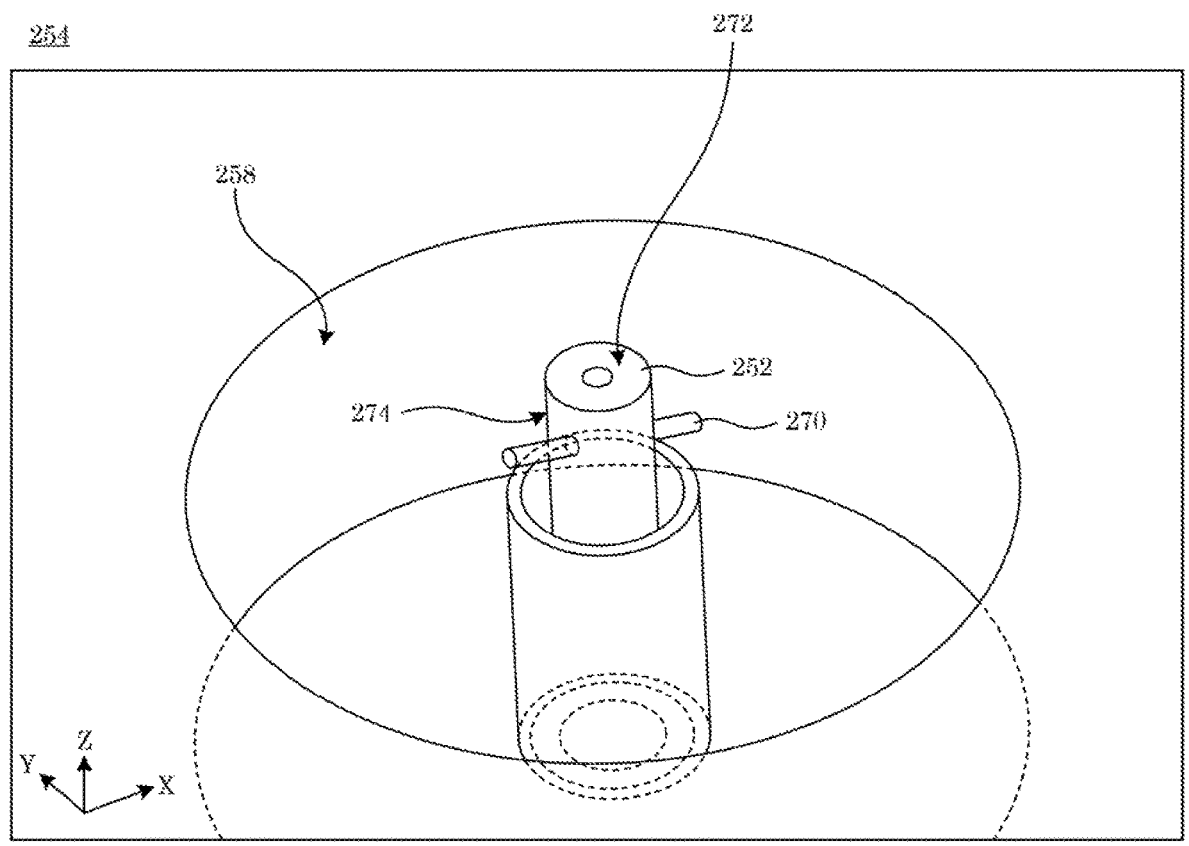
FIG. 21 shows an enlarged view of a portion of the wafer processing machine shown in FIG. 20.
Figure 22:
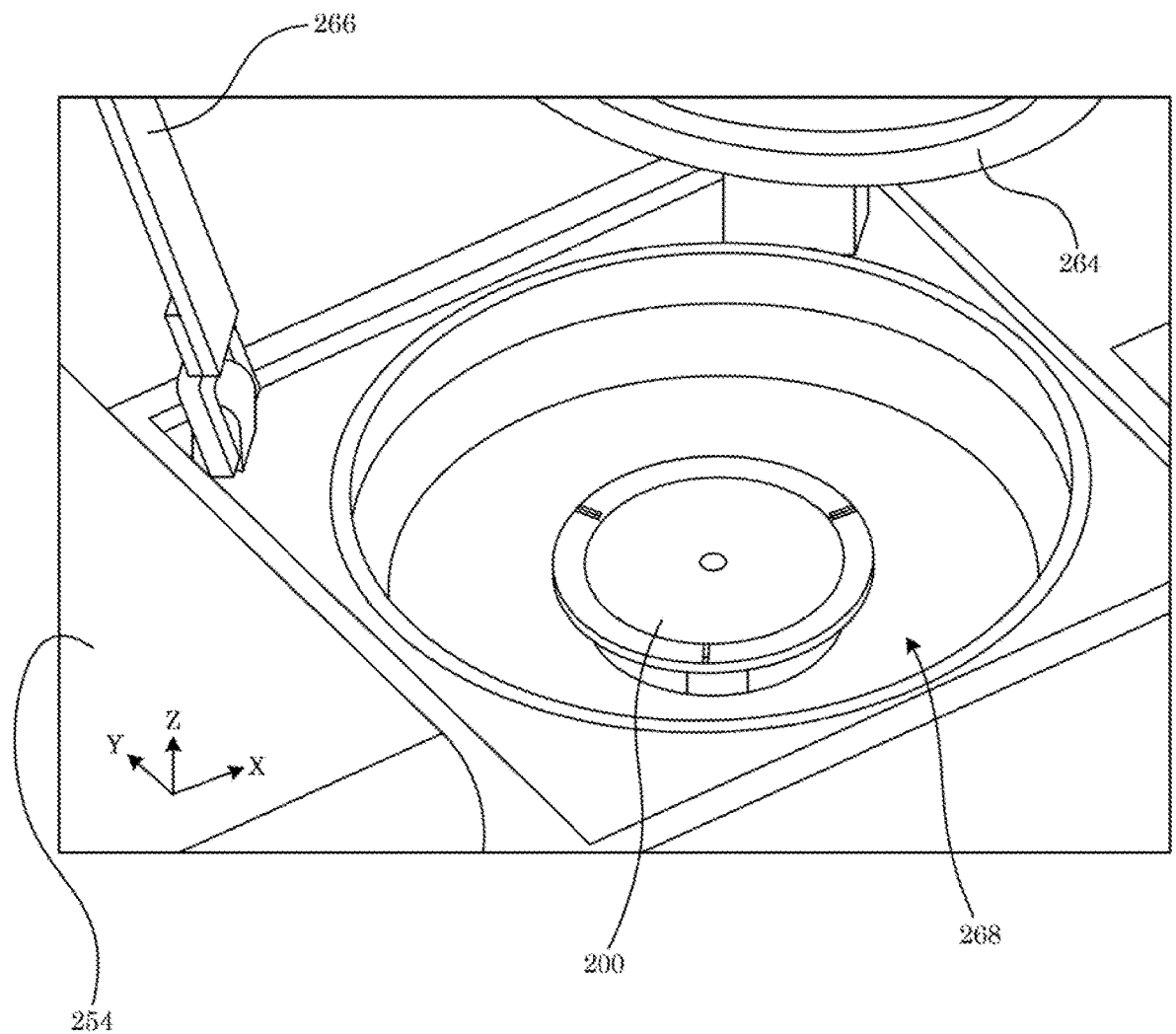
FIG. 22 shows an enlarged view of a portion of the wafer processing machine shown in FIG. 20 that includes a non-vacuum, non-contact spinner wafer chuck disposed on a spinner of the wafer processing machine.
Figure 23:
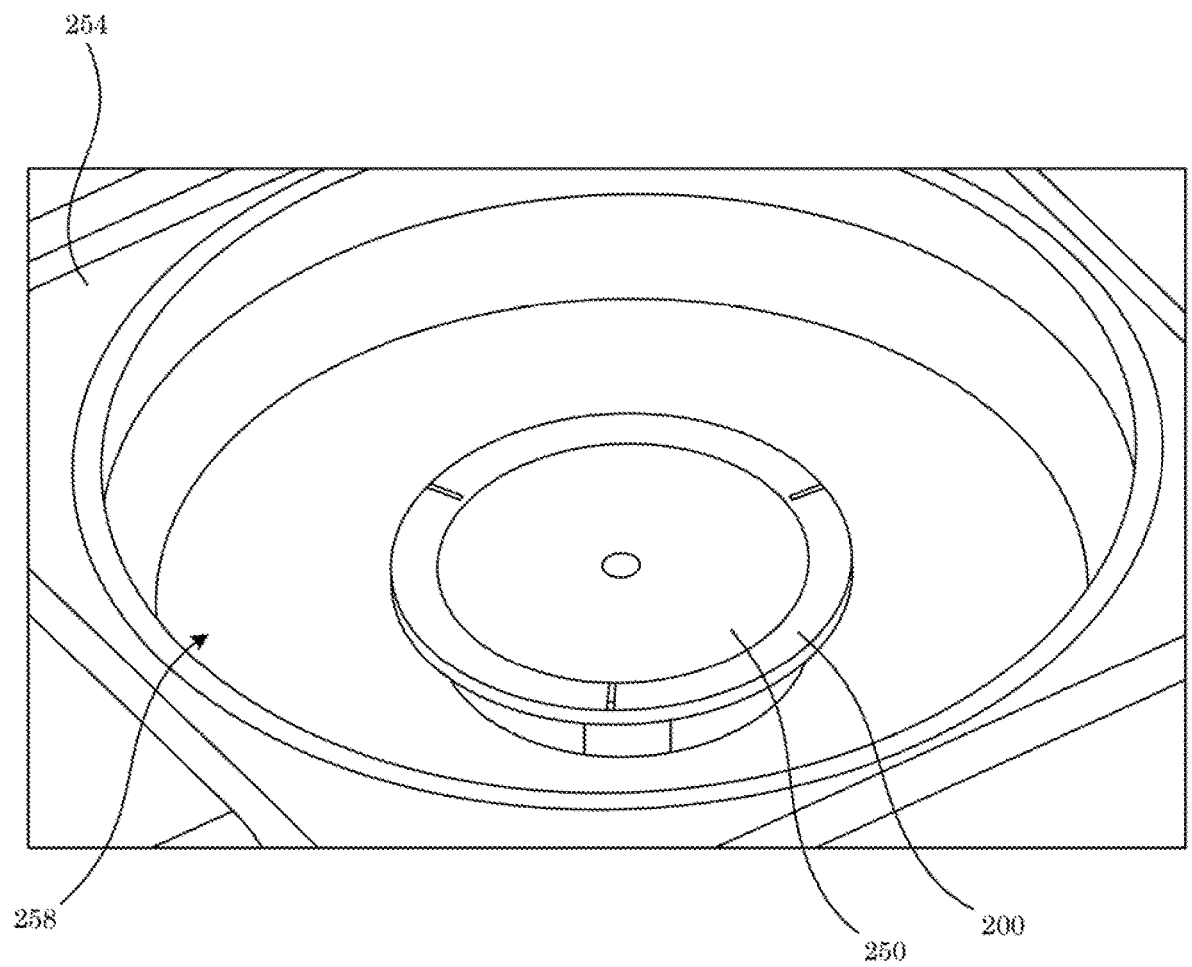
FIG. 23 shows an enlarged view of a portion of the wafer processing machine shown in FIG. 20 that includes a wafer disposed on a non-vacuum, non-contact spinner wafer chuck that is disposed on a spinner of the wafer processing machine.
Figure 24:
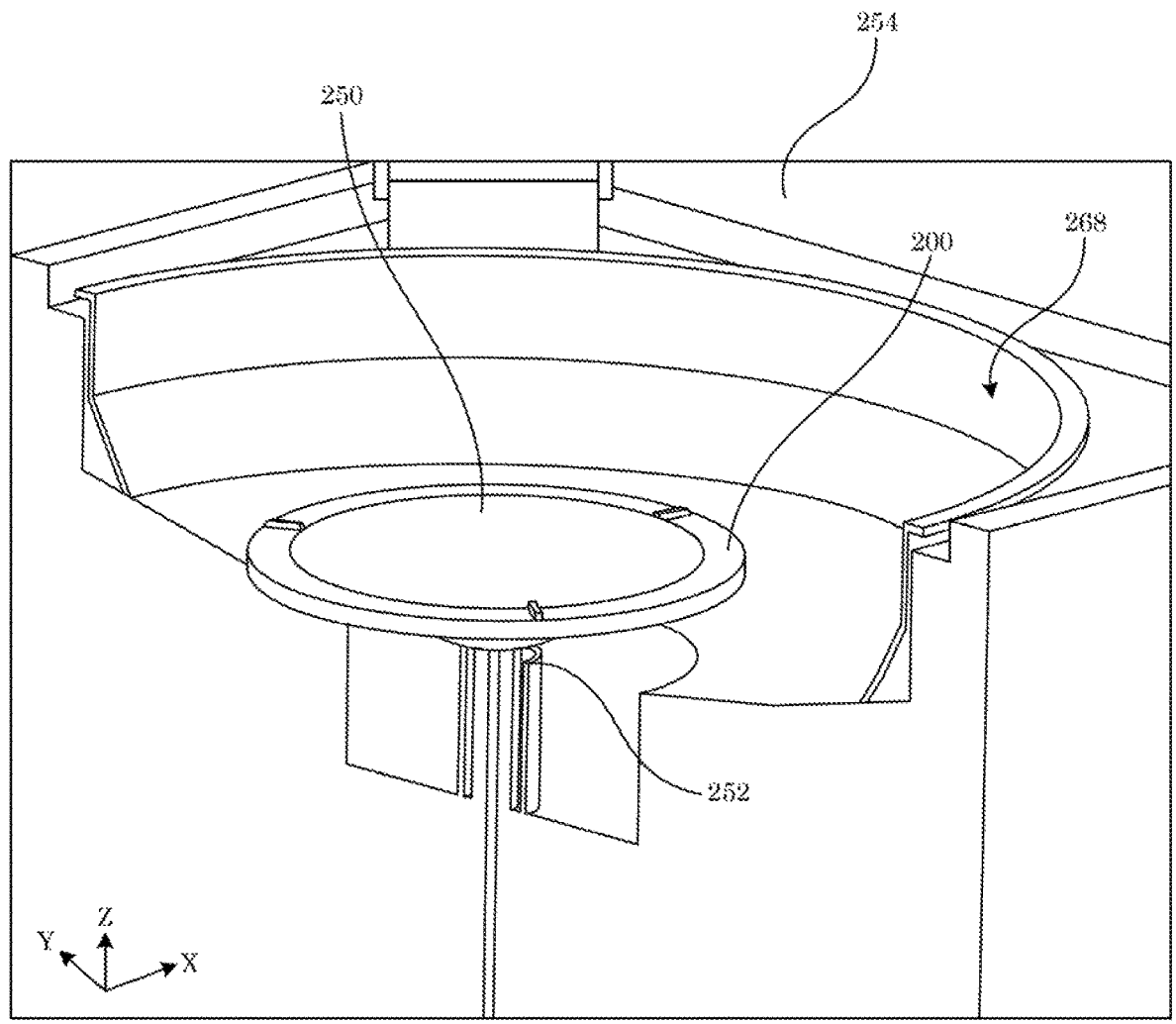
FIG. 24 shows a sectional view of the wafer processing machine with the wafer disposed on the non-vacuum, non-contact spinner wafer chuck that is disposed on the spinner of the wafer processing machine shown in FIG. 23.
Figure 25:
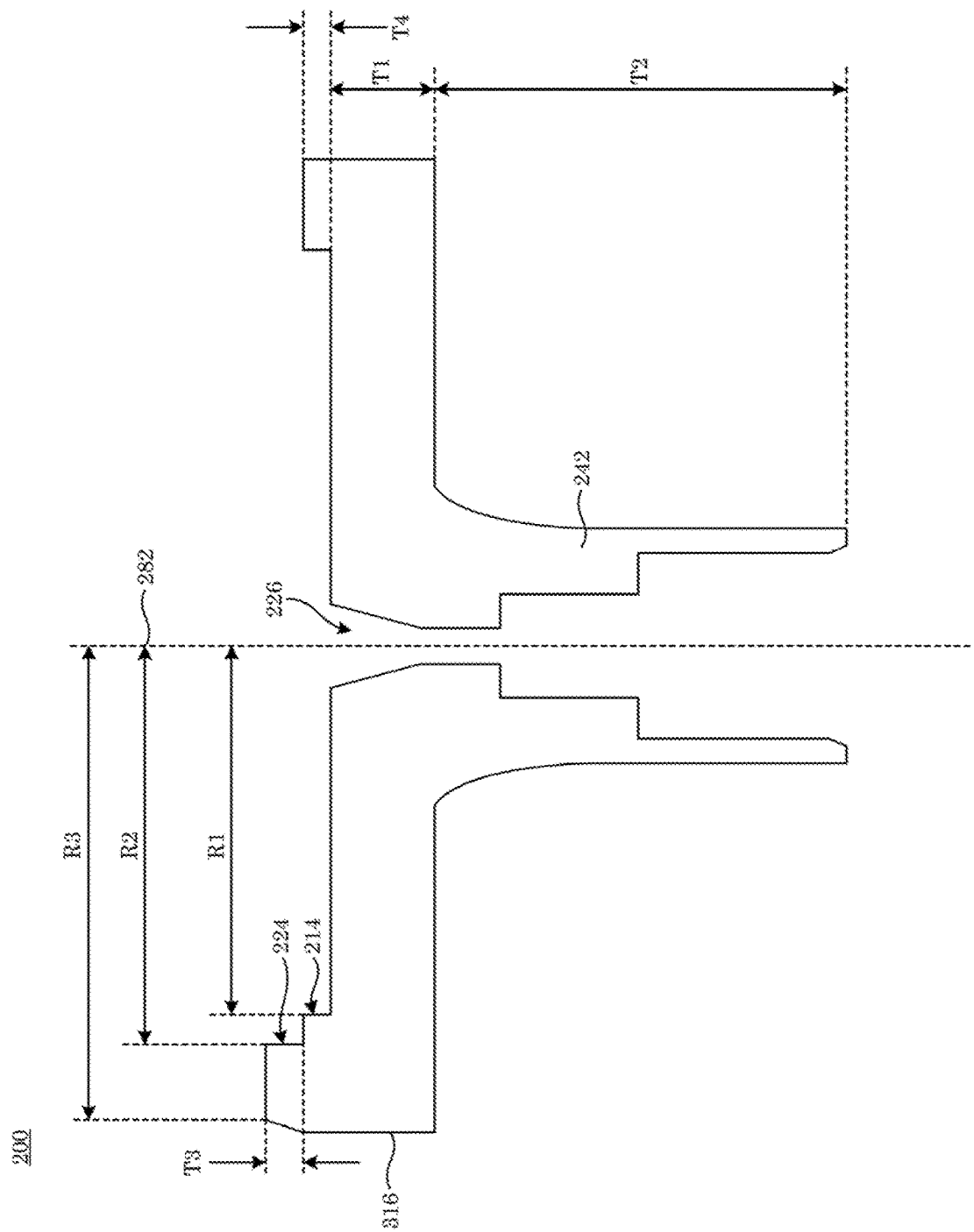
FIG. 25 shows the cross-section shown in FIG. 5 with dimension labels.

In an embodiment, with reference to FIG. 17, FIG. 18, and FIG. 25, protuberance platform 248 protrudes from chuck collar 212 so that index cam 222 engages with index edge 260 of wafer 250 in both counter clockwise rotation (e.g., see panel A of FIG. 21) and clockwise rotation (e.g., see panel B of FIG. 21) of wafer 250 relative to non-vacuum, non-contact spinner wafer chuck 200. It is contemplated that a radial length of protuberance platform 248 parallel to basal member 210 can be selected to so that engagement surface 230 proximate to index cam 222 is sufficiently long enough to engage wafer 250 at index cam 222. In an embodiment, with reference to FIG. 17, protuberance platform 248 is flanked by indentation 286 bounded by indentation surface 284 that provides space in surface 230 down to a same depth as wafer-side surface 232. In this manner, indentation 286 proximate to protuberance platform 248 provides installation and removal tools, e.g., tweezers, to be used to access wafer 250 when fully engaged by non-vacuum, non-contact spinner wafer chuck 200 FIG. 21. Panel C of FIG. 21 shows an enlarged view in operation after a counter clockwise rotation of wafer processing machine 254. It should be appreciated that indentation 286 proximate to protuberance platform 248 provides for tweezers access for installation and removal of wafer 250 on non-vacuum, non-contact spinner wafer chuck 200.

Wafer 250 can include a semiconductor (e.g., silicon and the like), fused silica, glass, ceramic, metal, plastic, and the like and can have a diameter, e.g., from 500 mm to 2 mm. In an embodiment, wafer 250 is silicon, wherein Miller indices of the atoms of the silicon in wafer 250 are indicated by index edge 260. Non-vacuum, non-contact spinner wafer chuck 200 uses engage index cam 222 via index face 224 to index edge 260 of wafer 250. Exemplary wafers 250 include silicon and have a diameter that is, e.g., 100 mm, wherein the wafer is a (111) p-type that can be 525 microns thick but can have an arbitrary diameter, thickness, and order of atoms. Moreover, it is contemplated that wafer 250 can be a single crystal wafer, have multiple crystalline facets, or be amorphous. It is contemplated that the thickness of wafer 250 can be from 0.1 mm to 10 mm. Moreover, wafer 250 includes round edge 258 proximate to index edge 260. A plurality of index edges 260 can be present that can be separated by round edges 258.

In an embodiment, with reference to FIG. 20, FIG. 21, FIG. 22, FIG. 23, and FIG. 24, wafer processing machine 254 includes spinner 252, lid 264, lid arm 266, loader 268, and spinner arm 270. Wafer processing machine 254 rotates non-vacuum, non-contact spinner wafer chuck 200 at a selected angular velocity to cause rotation of wafer 250 disposed thereon. Upon rotation of wafer 250, wafer 250 is subject to processing that can include thermal, chemical, or physical manipulation or modification. An exemplary chemical processing of wafer 250 is disposing a polymer composition on wafer 250 while spinning wafer 250 to homogenize a thickness of the polymer composition over the exposed surface of wafer 250. The polymer in the polymer composition can be cured, e.g., to form a photoresist that can then be subjected to photolithography for forming a mask or microstructure on wafer 250. A rotation rate of spinner 252 can be from less than 1 revolution per minute (RPM) (e.g., 0.1 RPM) to 100,000 RPM, specifically from 500 RPM to 3000 RPM. It is contemplated that wafer processing machine 254 can includes spinner 252, lid 264, lid arm 266, loader 268, and spinner arm 270 as shown in FIG. 20, FIG. 21, FIG. 22, FIG. 23, and FIG. 24. Spinner 252 is coupled to a motor in wafer processing machine 254 that rotates spinner 252 about a rotational axis of spinner 252. Spinner 252 can include spinner arm 270 that is received and engaged by wall 240 and slot receiver 244. Moreover, spinner 252 can include spinner terminus surface 272 that contacts shaft stop 276 of non-vacuum, non-contact spinner wafer chuck 200; and peripheral shaft surface 274 that can contact shaft limit surface 278 of non-vacuum, non-contact spinner wafer chuck 200. Spinner arm 270 can contact recess surface 280 of non-vacuum, non-contact spinner wafer chuck 200, but it is contemplated that a limiting contact so that spinner 252 cannot be further inserted into spinner arm receiver 238 occurs due to contact between shaft stop 276 and spinner terminus surface 272. A tolerance of shaft limit surface 278 for peripheral shaft surface 274 can be selected to so that peripheral shaft surface 274 is slip-fit into tightly or loosely against shaft limit surface 278.

With reference to FIG. 25, non-vacuum, non-contact spinner wafer chuck 200 can include various dimensions that are selected so that non-vacuum, non-contact spinner wafer chuck 200 is compatible with a certain wafer 250 or wafer processing machine 254. It is contemplated that non-vacuum, non-contact spinner wafer chuck 200 can be made in a variety of sizes to scale its dimensional lengths from microns to meters. For example, first thickness T1 can be from 2 mm to 10 mm, second thickness T2 can be from 3 mm to 25 mm; third thickness T3 can be from 1 mm to 20 mm; fourth thickness T4 can be from 1 mm to 20 mm; first radius R1 can be from 10 mm to 30 mm; second radius R2 can be from 12 mm to 40 nm; and third radius R3 can be from 16 mm to 50 mm, wherein radii are with respect to chuck centerline 282.

Non-vacuum, non-contact spinner wafer chuck 200 can be made in various ways. In an embodiment, a process for making non-vacuum, non-contact spinner wafer chuck 200 includes disposing a block of acetal homopolymer in a computer numerically controlled (CNC) machining process to remove portions of the block to form the structural elements of non-vacuum, non-contact spinner wafer chuck 200, e.g., those elements shown in FIGS. 1-18 and 20-24.

Disposing non-vacuum, non-contact spinner wafer chuck 200 on wafer processing machine 254 includes disposing non-vacuum, non-contact spinner wafer chuck 200 on spinner 252; coupling non-vacuum, non-contact spinner wafer chuck 200 to spinner 252 with fastener 256; disposing and engaging spinner arm 270 in slot receiver 244; optionally disposing spinner arm receiver 238 on spinner 252; and disposing wafer 250 on non-vacuum, non-contact spinner wafer chuck 200. It is contemplated that tweezers can be used to handle wafer 250 at index edge 260. Here, wafer 250 is disposed on engagement surface 230 of wafer 250, wherein round edge 258 engages engagement face 220 on wafer engagement cam 218 and wafer surface 262 engages engagement surface 230 via gravity. Index edge 260 of wafer 250 engages index face 224 of index cam 222 in response to rotation of wafer processing machine 254 and spinner 252. During operation, it is contemplated that wafer processing machine 254 can increase its angular velocity to a terminal angular velocity; dispense agent on wafer 250; flow the agent on wafer 250 via centrifugal force during rotation of wafer 250; and decrease the angular velocity until stopped. After stopping rotation, wafer 250 can be removed from non-vacuum, non-contact spinner wafer chuck 200 with tweezers by engaging index edge 260 of wafer 250; and removing wafer 250 from non-vacuum, non-contact spinner wafer chuck 200 by lifting wafer 250 therefrom to disengage engagement face 220 and index face 224 on wafer engagement cam 218 and index cam 222. Another wafer 250 can be disposed on non-vacuum, non-contact spinner wafer chuck 200 and subsequently processed.

Non-vacuum, non-contact spinner wafer chuck 200 and processes herein advantageously provide non-destructive processing of wafer 250. It should be appreciated that wafer 250 can have a delicate surface such as those used in nano photonic chips or thin membranes such as nano-resonator devices, wherein such surface can be destroyed if a conventional spinner chuck is used to connect wafer 250 to wafer processing machine 254. However, non-vacuum, non-contact spinner wafer chuck 200 allows surfaces of wafer 250 to remain scratch-free because there is no contact in a central portion of wafer 250 with non-vacuum, non-contact spinner wafer chuck 200. Scratches made by a conventional chuck can be a point of failure in making devices from wafer 250 because such formation can involve numerous steps that include re-disposal of wafer 250 on spinner 252 of wafer processing machine 254 to coat an agent on wafer 250 or to provide another mask step to occur. Also, a vacuum imparted on wafer 250 through a conventional chuck can crack or otherwise damage a thin membrane grown on wafer 250. Non-vacuum, non-contact spinner wafer chuck 200 overcomes these technical deficiencies and limitations of conventional vacuum chucks. Beneficially, non-vacuum, non-contact spinner wafer chuck 200 self-center of wafer 250 in response to rotation of non-vacuum, non-contact spinner wafer chuck 200 and accommodates changes in size of wafers 250 that can occur when processing a plurality of wafers 250, e.g., from different vendors or having different Miller indices.

In an embodiment, with reference to FIG. 25, non-vacuum, non-contact spinner wafer chuck 200 includes various dimensions that are selected so that non-vacuum, non-contact spinner wafer chuck 200 is compatible with a certain wafer 250 or wafer processing machine 254. For receipt of a 100 mm diameter wafer, dimensions are listed in the Table, wherein radii are with respect to chuck centerline 282.

| Table of dimensions for 100 mm wafer | |
|---|---|
| Dimension | Value (mm) |
| first thickness T1 | 3.8 |
| second thickness T2 | 15.6 |
| third thickness T3 | 1.6 |
| fourth thickness T4 | 1.0 |
| first radius R1 | 49.0 |
| second radius R2 | 50.0 |
| third radius R3 | 60.3 |

Non-vacuum, non-contact spinner wafer chuck 200 can be made in various ways. In an embodiment, a process for making non-vacuum, non-contact spinner wafer chuck 200 includes disposing a block of acetal homopolymer in a computer numerically controlled (CNC) machining process to remove portions of the block to form the structural elements of non-vacuum, non-contact spinner wafer chuck 200, e.g., those elements shown in FIGS. 1-18 and 20-24.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive; rather the elements can be used separately or can be combined together under appropriate circumstances.

What is claimed is:

1. A non-vacuum, non-contact spinner wafer chuck for receiving and indexing a wafer, the non-vacuum, non-contact spinner wafer chuck comprising:
a basal member comprising:
a wafer-side surface; and
a spinner-side surface opposing the wafer-side surface;
a fastener receiver disposed in the basal member and bounded by a receiver wall and that receives a fastener that fastens the non-vacuum, non-contact spinner wafer chuck to a wafer processing machine:
a chuck collar disposed on the basal member and comprising:
an inner collar wall that intersects the basal member at the wafer-side surface; and
an outer collar wall opposing the inner collar wall; and
an engagement surface that:
receives and engages the wafer; and
is interposed between the inner collar wall and the outer collar wall;
a wafer engagement cam disposed on the chuck collar and comprising:
an engagement face that faces toward the fastener receiver and that engages the wafer;
an index cam disposed on the chuck collar and comprising:
an index face that faces toward the fastener receiver and that engages the wafer, such that the index face of the index cam is disposed more proximate to the inner collar wall of the chuck collar relative to the engagement surface of the wafer engagement came; and
a spinner engager disposed on the spinner-side surface of the basal member and comprising:
a spinner arm receiver hounded by a wall and that receives a spinner of the wafer processing machine, wherein the wafer engagement cam and the index cam engage the wafer and maintains an orientation of the wafer with respect to the index cam in response to rotation of the wafer relative to the non-vacuum, non-contact spinner wafer chuck.

2. The non-vacuum, non-contact spinner wafer chuck of claim 1, further comprising a transition disposed on the spinner-side surface of the basal member and that is interposed between the basal member and the spinner engager.

3. The non-vacuum, non-contact spinner wafer chuck of claim 1, wherein the spinner engager further comprises a slot receiver disposed proximate to the spinner arm receiver and that receives a part of the spinner to rotate the non-vacuum, non-contact spinner wafer chuck relative to the wafer processing machine.

4. The non-vacuum, non-contact spinner wafer chuck of claim 1, wherein the index cam further comprises a cam outer surface opposingly disposed from the engagement face and that provides mechanical stability to the non-vacuum, non-contact spinner wafer chuck during rotation of the non-vacuum, non-contact spinner wafer chuck relative to the wafer processing machine.

5. The non-vacuum, non-contact spinner wafer chuck of claim 1, wherein the wafer engagement cam further comprises a cam outer surface opposingly disposed from the engagement face and that provides mechanical stability to the non-vacuum, non-contact spinner wafer chuck during rotation of the non-vacuum, non-contact spinner wafer chuck relative to the wafer processing machine.

6. The non-vacuum, non-contact spinner wafer chuck of claim 1, wherein the chuck collar further comprises a protuberance platform disposed on the basal member and that receives the wafer, wherein the protuberance platform is interposed between the basal member and the index cam such that the protuberance platform protrudes from the inner collar wall toward the fastener receiver.

7. A process for processing a wafer with the non-vacuum, non-contact spinner wafer chuck of claim 1, the process comprising:
disposing the non-vacuum, non-contact spinner wafer chuck on the wafer processing machine;
receiving the spinner by the spinner engager;
disposing the wafer on the non-vacuum, non-contact spinner wafer chuck;
rotating the non-vacuum, non-contact spinner wafer chuck relative to the wafer processing machine with the spinner; and
engaging, by the wafer engagement cam and the index cam, the wafer and maintaining, by the wafer engagement cam and the index cam, the orientation of the wafer with respect to the index cam in response to rotating the non-vacuum, non-contact spinner wafer chuck relative to the wafer processing machine to process the wafer.

* * * * *